United States Patent
Pushparaj et al.

(10) Patent No.: US 8,334,017 B2
(45) Date of Patent: Dec. 18, 2012

(54) APPARATUS AND METHODS FOR FORMING ENERGY STORAGE AND PHOTOVOLTAIC DEVICES IN A LINEAR SYSTEM

(75) Inventors: Victor L. Pushparaj, Sunnyvale, CA (US); Pravin K. Narwankar, Sunnyvale, CA (US); Dieter Haas, San Jose, CA (US); Bipin Thakur, Mumbai (IN); Mahesh Arcot, Thane (IN); Vikas Gujar, Thane (IN); Omkaram Nalamasu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 204 days.

(21) Appl. No.: 12/885,139

(22) Filed: Sep. 17, 2010

(65) Prior Publication Data

US 2011/0100955 A1 May 5, 2011

Related U.S. Application Data

(60) Provisional application No. 61/243,813, filed on Sep. 18, 2009.

(51) Int. Cl.
*C23C 16/00* (2006.01)
(52) U.S. Cl. ............... 427/255.7; 427/248.1; 427/249.1
(58) Field of Classification Search ............... 427/255.7, 427/248.1, 249.1
See application file for complete search history.

(56) References Cited

U.S. PATENT DOCUMENTS

| | | |
|---|---|---|
| 4,237,150 A | 12/1980 | Wiesmann |
| 4,237,151 A | 12/1980 | Strongin et al. |
| 5,776,819 A | 7/1998 | Mahan et al. |
| 6,069,094 A | 5/2000 | Matsumura et al. |
| 6,124,186 A | 9/2000 | Molenbroek et al. |
| 6,214,706 B1 | 4/2001 | Madan et al. |
| 6,258,408 B1 | 7/2001 | Madan et al. |
| 6,427,622 B2 | 8/2002 | Madan et al. |
| 6,468,885 B1 | 10/2002 | Mahan et al. |
| 6,495,258 B1 | 12/2002 | Chen et al. |

(Continued)

FOREIGN PATENT DOCUMENTS

JP 11-224952 8/1999

(Continued)

OTHER PUBLICATIONS

International Search Report and Written Opinion dated May 23, 2011 for International Application No. PCT/US2010/049335.

(Continued)

*Primary Examiner* — Kelly M Gambetta
(74) *Attorney, Agent, or Firm* — Patterson & Sheridan, LLP

(57) ABSTRACT

A method and apparatus are provided for formation of a composite material on a substrate. The composite material includes carbon nanotubes and/or nanofibers, and composite intrinsic and doped silicon structures. In one embodiment, the substrates are in the form of an elongated sheet or web of material, and the apparatus includes supply and take-up rolls to support the web prior to and after formation of the composite materials. The web is guided through various processing chambers to form the composite materials. In another embodiment, the large scale substrates comprise discrete substrates. The discrete substrates are supported on a conveyor system or, alternatively, are handled by robots that route the substrates through the processing chambers to form the composite materials on the substrates. The composite materials are useful in the formation of energy storage devices and/or photovoltaic devices.

10 Claims, 27 Drawing Sheets

U.S. PATENT DOCUMENTS

| | | |
|---|---|---|
| 6,653,212 B1 | 11/2003 | Yamanaka et al. |
| 6,656,339 B2 | 12/2003 | Talin et al. |
| 6,863,942 B2 | 3/2005 | Ren et al. |
| 6,897,603 B2 | 5/2005 | Mao et al. |
| 6,946,851 B2 | 9/2005 | Lee et al. |
| 7,122,736 B2 | 10/2006 | Wang et al. |
| 2003/0161950 A1 | 8/2003 | Ajayan et al. |
| 2004/0247808 A1 | 12/2004 | Cooper et al. |
| 2004/0252565 A1* | 12/2004 | Yamazaki et al. ............ 365/202 |
| 2004/0265211 A1 | 12/2004 | Dillon et al. |
| 2005/0042369 A1 | 2/2005 | Mao et al. |
| 2005/0152826 A1 | 7/2005 | Shatwell |
| 2006/0099136 A1 | 5/2006 | Dillon et al. |
| 2008/0299307 A1* | 12/2008 | Ward et al. ................. 427/249.1 |
| 2009/0075035 A1* | 3/2009 | O'Brien et al. ............ 428/195.1 |

FOREIGN PATENT DOCUMENTS

| | | |
|---|---|---|
| JP | 2006-219689 | 8/2006 |
| JP | 2007-115806 | 5/2007 |
| KR | 10-2005-0087247 | 9/2005 |

OTHER PUBLICATIONS

Schropp et al., "Hot Wire CVD of Heterogeneous and Polycrystalline Silicon Semiconducting Thin Films for Application in Thin Film Transistors and Solar Cells." Mater. Phys. Mech. 1 (2000), pp. 73-82.

\* cited by examiner

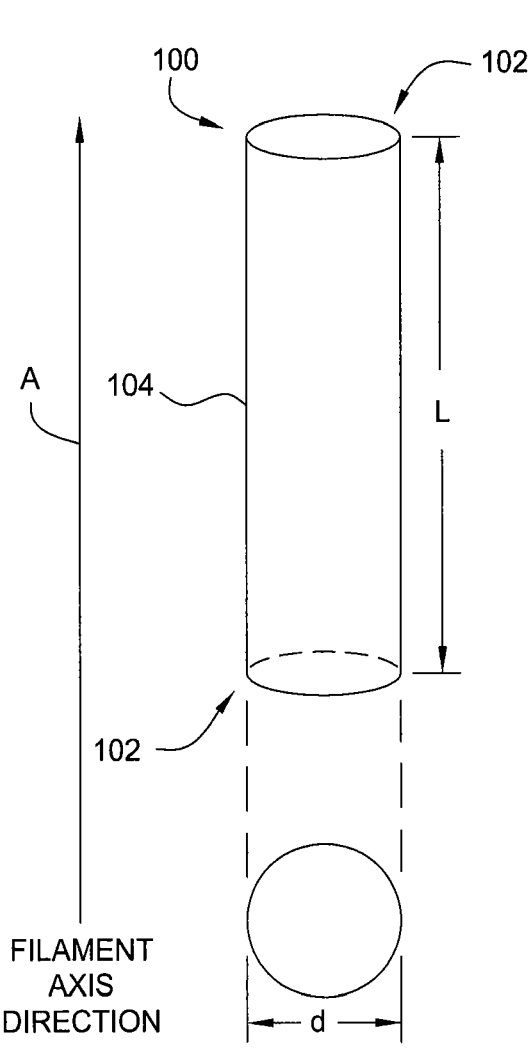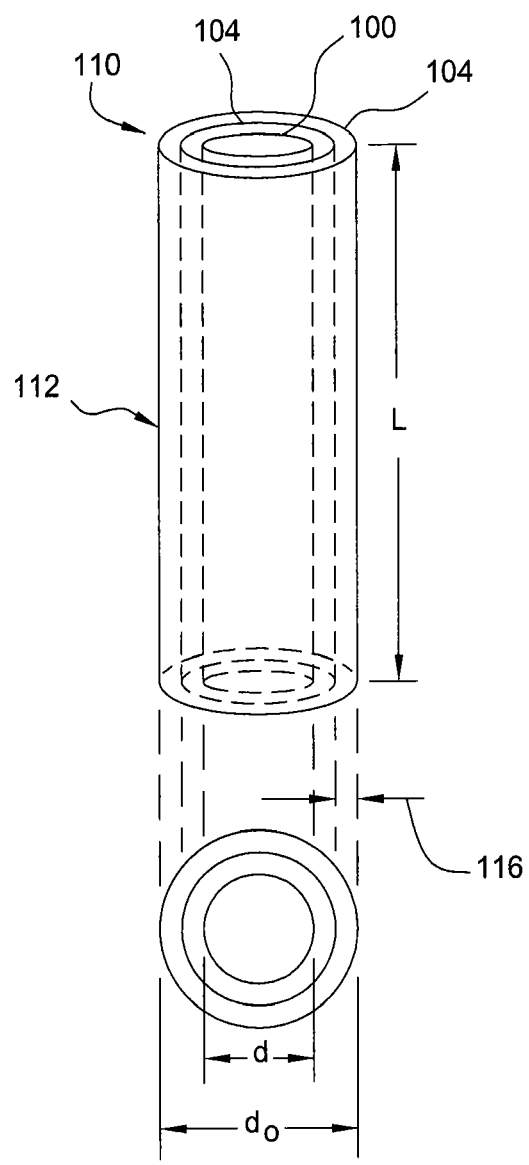
FIG. 1A
FIG. 1B

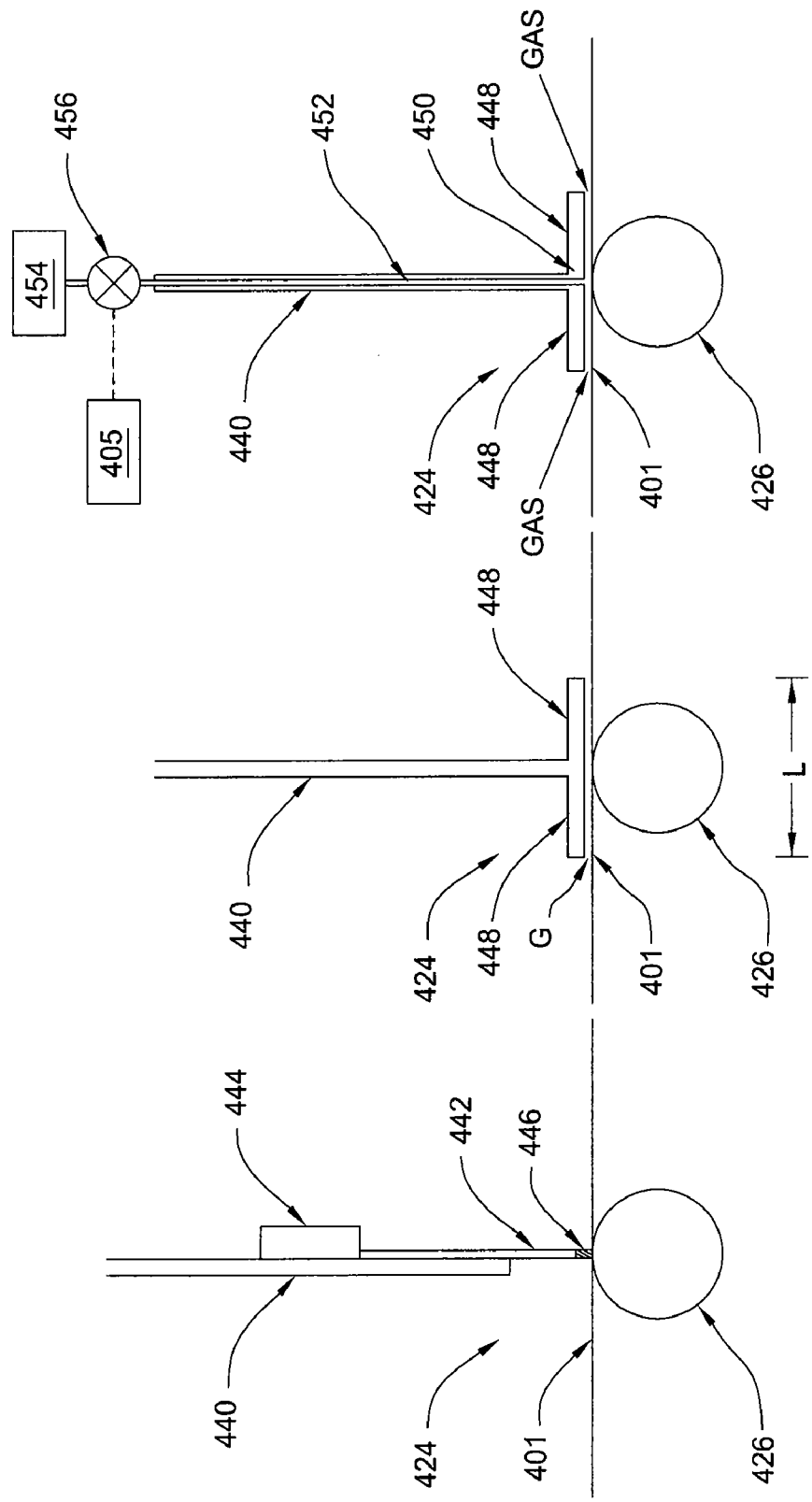

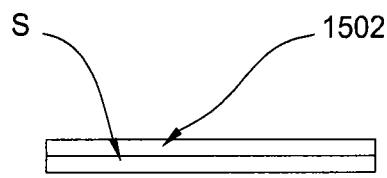
FIG. 15A
FIG. 15B
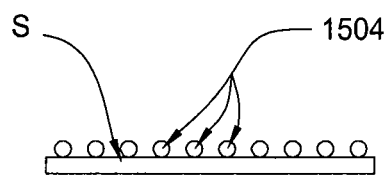
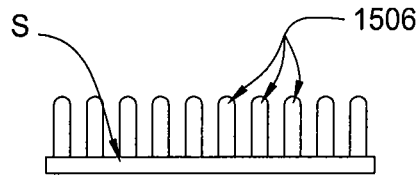
FIG. 15C
FIG. 15D
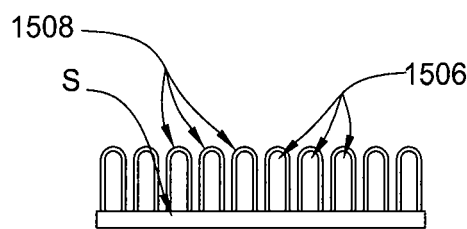
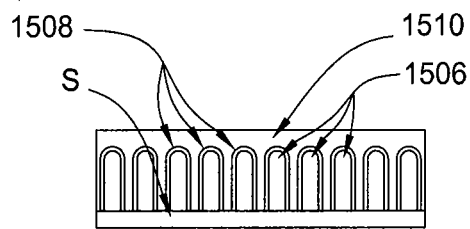
FIG. 15E
FIG. 15F
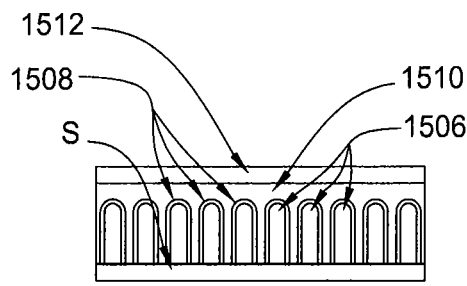
FIG. 15G

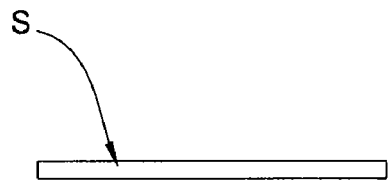
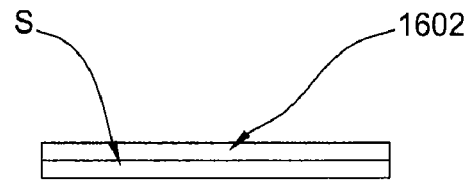
FIG. 16A	FIG. 16B
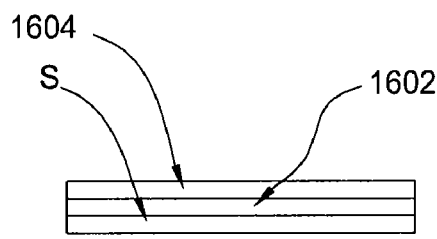
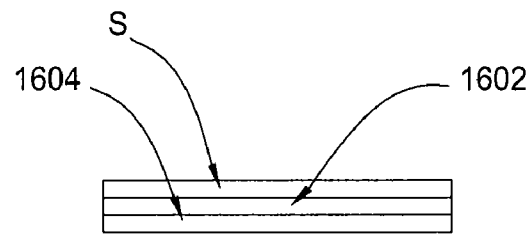
FIG. 16C	FIG. 16D
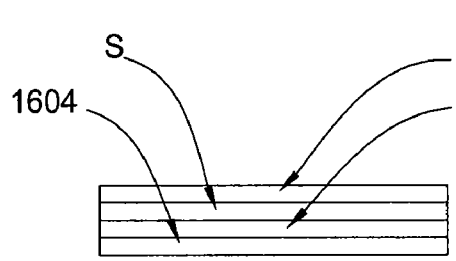
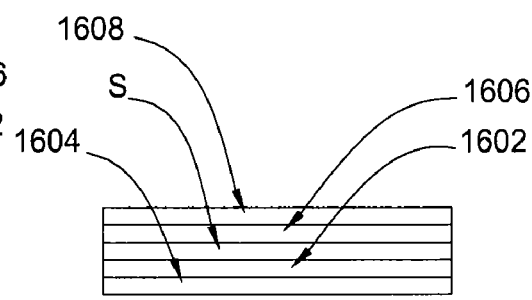
FIG. 16E	FIG. 16F

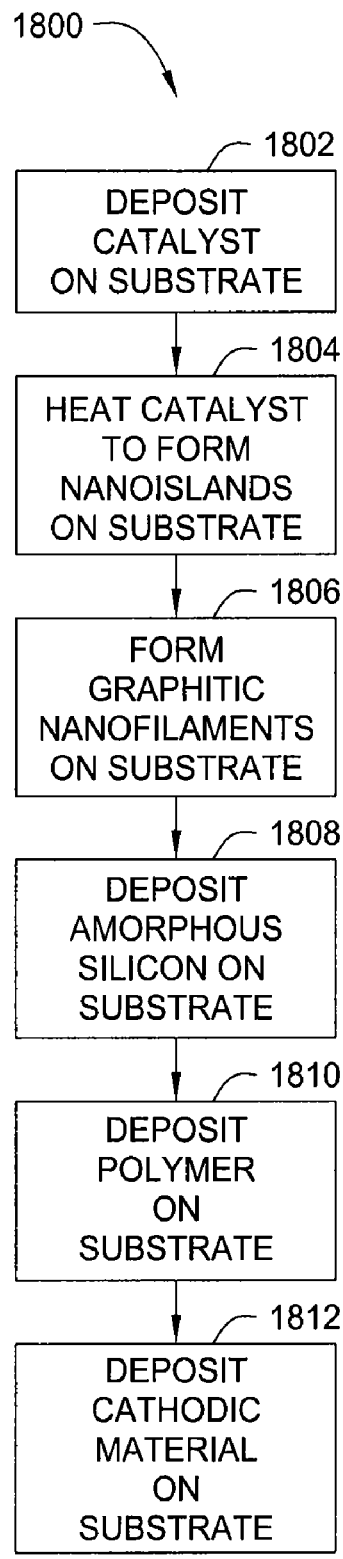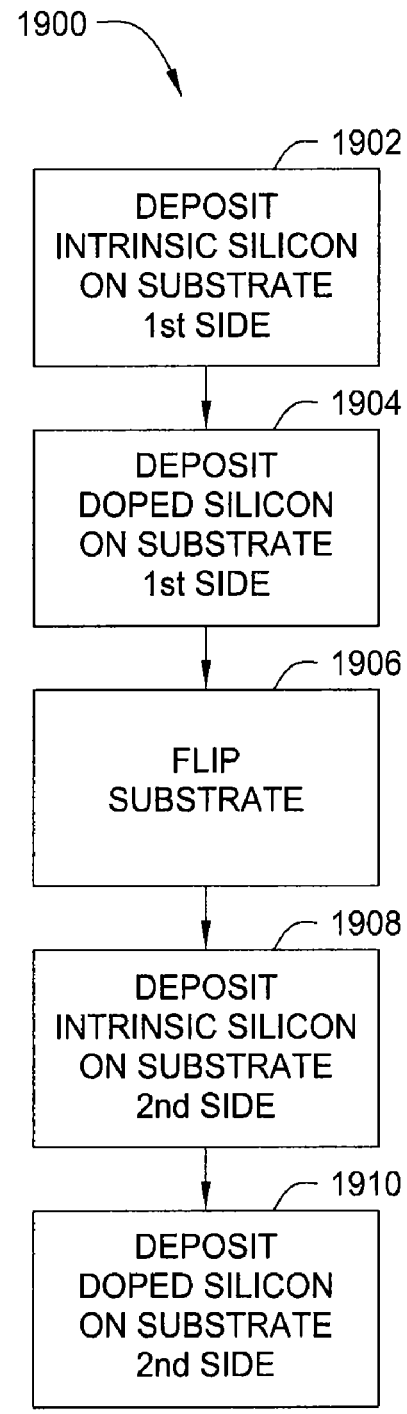
FIG. 18
FIG. 19

APPARATUS AND METHODS FOR FORMING ENERGY STORAGE AND PHOTOVOLTAIC DEVICES IN A LINEAR SYSTEM

CROSS-REFERENCE TO RELATED APPLICATIONS

This application claims benefit of U.S. provisional patent application Ser. No. 61/243,813, filed Sep. 18, 2009, which is herein incorporated by reference.

BACKGROUND OF THE INVENTION

1. Field of the Invention

Embodiments of the present invention generally relate to the formation of a composite material on a surface of a substrate. More specifically, embodiments of the invention relate to an apparatus and methods used to form composite materials that form part of an energy storage device and/or a photovoltaic device.

2. Description of the Related Art

Composite materials that may be formed using the apparatus and methods described herein include energy storage components and photovoltaic (PV) devices. Composite materials useful in energy storage components include nanotubes (and nanofibers) that are further coated to produce highly electrically conductive components, such as electrodes. Composite materials useful for forming PV devices, include intrinsic amorphous silicon (a-Si), n-type doped silicon (Si) and/or p-type doped silicon.

Carbon nanotubes and nanofibers possess many interesting and unique properties which make carbon nanotubes and nanofibers attractive for use in many potential applications, such as cold field emission, electrochemical energy storage, high-capacity hydrogen storage media, and composite material reinforcement, to name just a few. Some of the unique and interesting properties of carbon nanotubes include great strength, high electrical and thermal conductivity, large surface area-to-volume ratios, and thermal and chemical stability. The structures of carbon nanotubes and nanofibers give rise to many of their properties.

Carbon nanotubes and nanofibers are graphitic nanofilaments with diameters ranging from about 0.4 nanometers to about 500 nanometers and lengths which typically range from a few micrometers to a few millimeters. Graphitic nanofilaments may be categorized according to at least four distinct structural types, namely, tubular, herringbone, platelet, and ribbon. The term "nanotube" may be used to describe the tubular structure whereas "nanofiber" may describe the non-tubular forms.

Carbon nanotubes are generally classified as single-walled carbon nanotubes and multi-walled carbon nanotubes. FIG. 1A is a schematic view of a single-walled carbon nanotube (SWCNT). The SWCNT 100 is a graphitic nanofilament which comprises a cylindrical carbon molecule that may be conceptualized as a one-atom thick sheet of graphite called graphene rolled into a seamless graphene tube 104 of diameter "d" and filament length "L." The graphene tube 104 forms a cylindrical wall which is parallel to the filament axis direction. One or more of the nanotube ends 102 may be capped (see FIG. 2A) by additional carbon atoms. The diameter "d" may range from about 0.4 nanometers to a few nanometers and the filament length "L" may range from a few micrometers to a few millimeters.

The rolled graphene layer or sheet of the SWCNT 100 comprises six-member hexagonal rings of carbon atoms held together by covalent $sp^2$ bonds. These bonds combined with the tubular graphene structure impart extraordinary strength (tensile strength) and stiffness (elastic modulus) to carbon nanotubes. The SWCNT 100, for example, may have an average tensile strength of about 30 GPa and an elastic modulus of about 1 TPa compared to stainless steel which may have a tensile strength of about 1 GPa and an elastic modulus of about 0.2 TPa. Carbon nanotubes also have a fairly low density for a solid (about 1.3 $g/cm^3$ for SWCNT's 100), and their strength-to-weight ratio is among the highest of known materials. The electrical conductivity of the SWCNT 100 may be semiconducting or metallic depending upon how the graphene sheet is rolled to form the graphene tube 104, and metallic-type carbon nanotubes can carry electrical current densities orders of magnitude larger than those carried by the best conducting metals.

FIG. 1B is a schematic view of a multi-walled carbon nanotube (MWCNT). The MWCNT 110 may be conceptualized as one or more graphene tubes 104 of filament length "L" coaxially arranged about the SWCNT 100 of diameter "d." The graphene tubes 104 form cylindrical walls which are parallel to the filament axis direction "A" and the walls are separated from each other by an interlayer spacing 116 of about 0.34 nm which approximates the distance between graphene layers in graphite. The number of tubes (three are shown) or cylindrical walls within the MWCNT 110 may range from two to fifty, or more. An outer nanotube 112 has a filament diameter "$d_o$" which may range from a few nanometers to several hundred nanometers or more depending upon the number of walls within the MWCNT 110.

The term "carbon nanotube" is typically used to describe a nanofilament which comprises one or more graphene layers or sheets which are parallel to the filament axis and which form tubular structures. The term "carbon nanofiber," on the other hand, typically describes a nanofilament which comprises graphene layers which may or may not be parallel to the filament axis and which do not form tubular structures, although the structures may be formed so that the nanofibers are substantially round or polygonal in cross-section. Examples of nanofiber structures include herringbone, platelet, ribbon, stacked-cone, and other carbon nanofiber structures known in the art. Some nanofibers may have a hollow core or central hole along the filament axis of each nanofiber, while other nanofibers may have solid cores. While the term "carbon nanotube" is used herein, it should be understood that this term may refer to a carbon nanotube and/or carbon nanofiber. The carbon nanotubes may have overall shapes which include but are not limited to straight, branched, twisted, spiral, and helical.

The tubular structure of carbon nanotubes have some unique properties which are not shared by carbon nanofibers. Carbon nanofibers are more closely related to graphite which consists of graphene layers held together by interlayer van der Waals forces which are much weaker than the intra-layer bonding forces within each graphene layer. The properties of carbon nanofibers are determined by the combination of the strong intra-layer bonds and the weaker interlayer bonds of the graphene structures, whereas the properties of carbon nanotubes are determined more by the strong intra-layer bonds in the tubular graphene structures. As a result, some of the properties of carbon nanofibers may be characterized as being intermediate to the properties of carbon nanotubes and graphite.

The properties of carbon nanotubes and nanofibers make their potential use in various applications desirable. The low density, high mechanical strength, electrical conductivity, and thermal conductivity of carbon nanotubes make them attractive for potential use in composite material applications.

Carbon nanofibers also have fairly low densities and may be used to improve the mechanical strength and electrical conductivity of composite materials, although carbon nanofibers typically possess much less strength than carbon nanotubes.

Carbon nanotubes and nanofibers are also attractive for potential use in energy storage applications, such as electrodes for lithium-ion batteries, supercapacitors, or fuel cells. The large surface areas of carbon nanotubes and nanofibers can form large surface areas which may provide improved charge storage capabilities for electrodes. Carbon nanofibers, in particular, have many interlayer spacings through which small ions may enter and intercalate between the graphene layers, and this property makes carbon nanofibers attractive for electrode applications. It may also be desirable to deposit additional materials, such as metals, for example, onto the carbon nanotubes or nanofibers to enhance or modify various properties (e.g., electrical conductivity, strength, stiffness, thermal expansion, density) of the composite material.

Carbon nanotubes are typically formed using laser ablation, arc discharge, or chemical vapor deposition (CVD). The techniques of laser ablation and arc discharge typically use higher processing temperatures than CVD and the higher temperatures facilitate the formation of nanotubes. However, laser ablation and arc discharge form nanotubes separately (i.e., not directly on substrates) and require post-production processing (e.g., recovery, sorting, purification) of the nanotubes before they can be applied to substrates. In contrast, CVD methods allow the formation of carbon nanotubes and nanofibers directly onto substrates. Additionally, CVD methods can produce nanotubes and nanofibers at lower temperatures while providing control over the types and sizes of carbon nanotubes and nanofibers produced. Thus, CVD may provide a cost effective means for forming carbon nanotubes or nanofibers on large area substrates.

The use of various types of substrates on which the composite materials are formed may increase the range of applications for the composite materials. The substrates may include wafers, panels, sheets, webs, and fibers, for example. Thus, it is desirable to provide a cost effective means for forming carbon nanotubes and nanofibers on a substrate that that can be used to form part of an electrode used in a battery, supercapacitor, or fuel cell. Additionally, it is desirable to provide a cost effective means for the metallization of carbon nanotubes and nanofibers formed on large area substrates used in composite materials.

One method of forming a PV cell is by depositing intrinsic silicon (i-Si) and doped silicon layers on a substrate. As the need for cost effective energy sources rises, it becomes more desirable to develop methods and apparatus for forming larger PV cells. In order to do so, the ability to deposit these composite materials on ever larger substrates, also has become more desirable.

Therefore, a need exists for a cost effective method and apparatus for the formation of composite materials on various types of substrates.

SUMMARY OF THE INVENTION

Embodiments of the present invention include methods and apparatus for the formation of composite materials, which include metallized graphitic nanofilaments and intrinsic and doped silicon on various types of large area substrates, as well as the composite materials formed using these methods and apparatus.

In one embodiment, the invention is a method for forming composite materials on substrates. The method includes depositing a catalytic layer on a surface of a substrate in a first processing chamber, processing the catalytic layer to form a plurality of nanoislands, forming a plurality of graphitic nanofilaments over the nanoislands in a second processing chamber, wherein the second processing chamber is coupled to the first processing chamber, depositing a silicon containing layer over the graphitic nanofilaments in a third processing chamber which is coupled to the second processing chamber and depositing a polymer layer over the graphitic nanofilaments and silicon containing layer in a fourth processing chamber which is coupled to the third processing chamber.

In another embodiment, the invention is a method of forming composite materials on a substrate in a substrate processing system. The method includes depositing a catalytic layer on a surface of a substrate in a first processing chamber by delivering a catalytic precursor from a first source, processing the catalytic layer to form a plurality of nanoislands while the substrate is disposed in the first processing chamber, forming a plurality of graphitic nanofilaments over the nanoislands in the first processing chamber by delivering a carbon containing gas from a first source, depositing a silicon containing layer over the graphitic nanofilaments in a second processing chamber which is coupled to the first processing chamber and depositing a polymer layer over the graphitic nanofilaments and silicon containing layer in a third processing chamber which is coupled to the second processing chamber.

In a further embodiment, the invention is an apparatus for forming composite materials on a substrate. The apparatus includes a first end, a second end, at least one web of material extending from the first end to the second end, a support system to support the at least one web of material from the first end to the second end and a plurality of chambers disposed between the first and the second end, the plurality of chambers being adapted and configured to form the composite material on the substrate, wherein the at least one web of material extends through the plurality of chambers.

In another embodiment, the invention is an apparatus for forming composite materials on a substrate. The apparatus includes a first end, a second end, a first chamber disposed between the first and the second end, a second chamber disposed between the first and the second end, a third chamber disposed between the first and the second end, a fourth chamber disposed between the first and the second end and a support system that is configured to transfer a substrate through the first, second, third and fourth chambers. The first chamber has a target having a surface in contact with a processing region, wherein the target includes a catalytic material and a power supply adapted to deliver energy to the target so that atoms from the surface of the target are deposited on a surface of a substrate disposed in the processing region. The second chamber has a heater configured to transfer heat to the surface of the substrate disposed in the processing region of the second chamber. The third chamber includes a first heated filament disposed within a processing region of the third chamber and a first source that is configured to deliver a carbon containing gas past the first heated filament and to a surface of a substrate that is disposed in the processing region of the third chamber. The fourth chamber has a second heated filament disposed within a processing region of the fourth chamber and a second source that is configured to deliver a carbon containing gas past the second heated filament and to a surface of a substrate that is disposed in the processing region of the third chamber.

In yet a further embodiment, the invention is a composite material including a substrate, a plurality of graphitic nanofilaments disposed on the substrate, a silicon containing layer disposed on the plurality of graphitic nanofilaments, a layer of polymeric material disposed on the layer of silicon and a layer of cathodic material disposed on the layer of polymeric material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1A is a schematic view of a single-walled carbon nanotube.

FIG. 1B is schematic view of a multi-walled carbon nanotube.

FIGS. 4B-4D show several embodiments of substrate transfer ports.

FIGS. 15A-15G are schematic side views showing the various stages of forming carbon nanotube based composite materials according to embodiments of the invention.

FIGS. 16A-16F are schematic side views showing the various stages of forming silicon based composite materials according to embodiments of the invention.

FIG. 18 is a process flow chart summarizing a method for forming a composite layer on a substrate according to one embodiment of the invention.

FIG. 19 is a process flow chart summarizing a method for forming a portion of a solar cell device according to one embodiment of the invention.

To facilitate understanding, identical reference numerals have been used, where possible, to designate identical elements that are common to the figures. It is contemplated that features of one embodiment may be incorporated in other embodiments without further recitation.

DETAILED DESCRIPTION

Figure 2A:
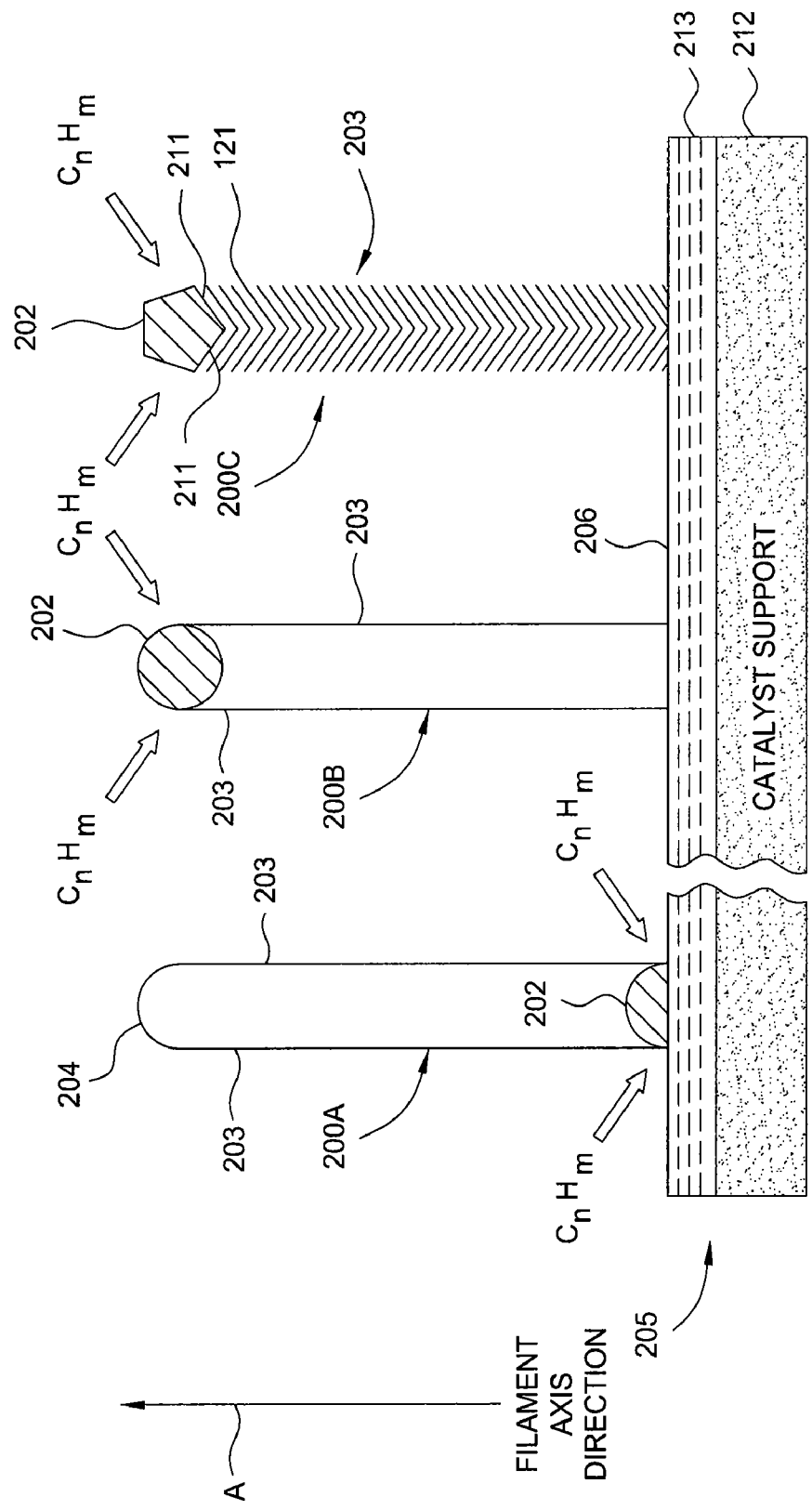
FIG. 2A is a schematic view of nanotubes and nanofibers formed by two catalytic CVD growth processes which use a catalyst support substrate.

Embodiments of the present invention generally provide a cost effective method and apparatus for forming graphitic nanofilaments (i.e., carbon nanotubes and/or nanofibers) on various types of substrates and then coating the graphitic nanofilaments with other types of materials to form a composite material, which can be used to form part of an electrode that may used in a battery, supercapacitor, or fuel cell. The substrates may comprise various materials and structural forms such as fibers, sheets of woven fibers, glass or metal plates, metal foils, polycrystalline silicon substrates, semiconductor wafers, oxidized metal containing substrate, oxidized semiconductor substrate, or other similar substrate material, for example.

The composite material containing graphitic nanofilaments may be used for various applications, such as a large surface area electrode or current collector in an electrochemical storage device, for example. The electrochemical storage device (e.g., battery, supercapacitor, fuel cell) may be formed by depositing additional material layers onto the metallized graphitic nanofilaments of the composite material. In one embodiment, portions of the resulting electrochemical storage device may be integrated into a woven sheet, panel, or other flexible structure depending upon the type of substrate used to form the composite material.

CVD Growth Processes for Graphitic Nanofilaments

In one embodiment, the composite material containing graphitic nanofilaments may be formed using different deposition and processing techniques. One desirable processing technique that can be used to form the graphitic nanofilaments is a chemical vapor deposition (CVD) process. The chemical vapor deposition (CVD) techniques used to form graphitic nanofilaments may be generally categorized into two types: catalytic and non-catalytic. The methods which use catalyst materials to facilitate and help control the growth of graphitic nanofilaments are referred to as catalytic CVD methods. The methods which use no catalyst materials for graphitic nanofilament growth are referred to as non-catalytic or pyrolytic CVD methods since only heating, and not catalysis, typically drives nanofilament growth. The catalytic CVD methods often provide greater control over graphitic nanofilament growth than non-catalytic methods. Various methods of graphitic nanofilament growth are described by K. Teo et al., in "Catalytic Synthesis of Carbon Nanotubes and Nanofibers," Encyclopedia of Nanoscience and Nanotechnology, Volume X, pg. 1-22, American Scientific Publishers, 2003.

The use of substrates for the catalytic CVD growth of graphitic nanofilaments provides some advantages over "floating" catalytic methods which do not require substrates or supporting surfaces for the catalyst materials. First, in some applications, it may be desirable to form graphitic nanofilaments directly on a surface which forms part of a functional structure. For example, it may be desirable to deposit graphitic nanofilaments at the bottom of a small aperture on a substrate to form a field emission electron source, and space limitations may make direct growth of the graphitic nanofilaments on a surface of the aperture the only practical means to achieve the deposition. Second, the use of a substrate makes it possible to anchor catalyst nanoparticles to a surface in order to control the size of the catalyst nanoparticles. At typical CVD nanofilament growth temperatures (e.g., 500° C. to 900° C.), the catalyst nanoparticles (typically metal) have sufficient mobility and cohesive forces to coalesce into larger particles. The anchoring of the catalyst nanoparticles can prevent such coalescence and help control the diameters of the graphitic nanofilaments. Third, the use of a substrate can facilitate the alignment of the graphitic nanofilaments.

FIG. 2A is a schematic view of graphitic nanofilaments formed by two catalytic CVD growth processes that use a catalyst support 205, which comprises a substrate that is discussed above. The CVD growth of carbon nanotubes involves heating catalyst particles 202 to a high temperature and flowing a carbon source gas, such as a hydrocarbon ($C_nH_m$), carbon monoxide, or other carbon-containing gas over the catalyst particles 202 for a period of time. The catalyst particles 202 reside on a support surface 206 of the catalyst support 205. The catalyst particles 202 are typically nanometer scale in size, and the diameters or widths of the graphitic nanofilaments are often closely related to the sizes of the catalyst particles 202.

The catalyst particles 202 comprise any suitable catalyst materials for graphitic nanofilament growth, but preferred materials are the transition metals and transition metal oxides. The catalyst materials may include but are not limited to iron (Fe), cobalt (Co), nickel (Ni), copper (Cu), silver (Ag), magnesium (Mg), ruthenium (Ru), rhodium (Rh), iridium (In), platinum (Pt), palladium (Pd), molybdenum (Mo), tungsten (W), chromium (Cr), and alloys, oxides, and combinations thereof. Combinations or mixtures of catalyst materials which may be used include but are not limited to iron-nickel, iron-molybdenum, iron-cobalt, cobalt-nickel, and cobalt-molybdenum. Preferred catalysts include iron (Fe), cobalt (Co), nickel (Ni) and alloys thereof.

The catalytic CVD growth of graphitic nanofilaments typically involves the catalytic dissociation of a hydrocarbon source gas into carbon and hydrogen at the surfaces of a transition metal particle which acts as a catalyst. Not wishing to be bound by theory, it is believed that, at high temperatures, the carbon has solubility in the transition metal particle and the carbon dissolves into and diffuses through the metal to form a carbon saturated metal-carbon solution. The carbon precipitates from the saturated solution at one or more surfaces of the metal particle to grow a graphitic nanofilament with a diameter substantially equal to the diameter of the metal particle.

Referring to FIG. 2A, the catalytic growth of graphitic nanofilaments may proceed by a tip-growth or base-growth process. If the interaction between the catalyst particle 202 and the catalyst support 205 is strong, the precipitation of carbon atoms may produce a base-growth nanotube 200A with tubular nanofilament walls 203 that grow up around the catalyst particle 202 which remains attached to the catalyst support 205 at the base of the nanotube. The base-growth nanotube 200A typically forms a hemispherical cap 204 of carbon atoms opposite the base of the nanotube. Alternately, if the interaction between the catalyst particle 202 and the catalyst support 205 is weak, the nanotube may grow so as to lift the catalyst particle 202 away from the catalyst support 205 and form a tip-growth nanotube 200B with the catalyst particle 202 located at the tip of the nanotube. The nanotubes shown in FIG. 2A are single-walled, but multi-walled structures may be formed by similar growth processes. The graphitic nanofilament grows in the filament axis direction "A" as carbon precipitates from one or more surfaces of the catalyst particle 202 for both the tip-growth and base-growth processes.

Carbon nanofibers may also grow by a tip-growth or base-growth process depending upon the strength of interaction between the catalyst particle 202 and catalyst support 205. A carbon nanofiber may form when the catalyst particle 202 has one or more faceted or planar surfaces 211, whereas the catalyst particle 202 may be more spherical in shape for the formation of a carbon nanotube. A tip-growth nanofiber 200C of the herringbone-type may be formed when the catalyst particle 202 has two planar surfaces 211 at an angle to each other. Carbon precipitates at the planar surfaces 211 to form graphene sheets 121 parallel to the planar surfaces 211 and at an angle to the filament axis direction. The edges of the graphene sheets 121 form nanofilament walls 203 for the tip-growth nanofiber 200C.

In one embodiment, the catalyst support 205 comprises a support material 212 covered with an optional buffer layer 213. The support material 212 may comprise aluminum oxide, silicon oxide, silicon, glass, metals or other materials which are stable in the range of temperatures used for graphitic nanofilament growth. In one embodiment, the support material 212 is the substrate, which, as discussed above, may comprise structural elements that are formed into sheets of woven fibers, glass plates, metal plates, metal foils, polycrystalline silicon substrates, semiconductor wafers, oxidized metal containing substrate, oxidized semiconductor substrate, or other similar structure. The buffer layer 213 comprises a buffer material (e.g., titanium nitride, silicon dioxide) which prevents the catalyst particles 202 from reacting or alloying with the support material 212 at the nanofilament growth temperature. Such reacting or alloying of the catalyst particles 202 with the support material 212 may be undesirable since it can effectively reduce or consume the catalyst particles 202 and thereby reduce the growth yield of graphitic nanofilaments. The buffer layer 213 may also act as a diffusion barrier to prevent the catalyst particles 202 from diffusing into the support material 212. In one embodiment, the catalyst support 205 comprises a buffer layer 213 which is patterned to cover some areas of the support material 212 and not cover other areas of the support material 212. In one embodiment, the buffer layer 213 is suitably adapted to allow limited reaction between the catalyst particles 202 and support material 212. In another embodiment, the catalyst support 205 comprises the support material 212 without the buffer layer 213.

Catalyst Preparation

Various methods may be used to prepare the catalysts and the catalyst supporting surfaces used for graphitic nanofilament growth. The catalyst particles 202 may be deposited onto the catalyst support 205 using wet or dry deposition techniques. Dry deposition techniques include, but are not limited to, physical vapor deposition processes (or sputtering), thermal evaporation, and CVD. Wet deposition techniques include, but are not limited to, the techniques of wet catalyst, colloidal catalyst solutions, sol-gel, electrochemical plating, and electroless plating.

Figure 2B:
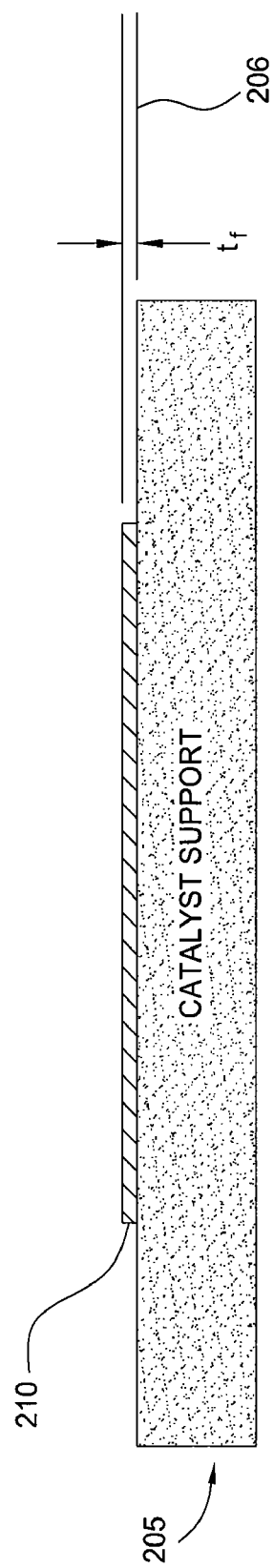
FIG. 2B is a schematic view of a catalyst film on a catalyst support.

One method for forming catalyst particles 202 on a catalyst support 205 begins by depositing a thin layer or film of catalyst material on the catalyst support 205 using a dry deposition process technique. FIG. 2B is a schematic view of a catalyst film 210 on a catalyst support 205. The catalyst film 210 may be deposited by sputtering, thermal evaporation, atomic layer deposition (ALD), CVD or other dry deposition techniques. The catalyst film 210 may comprise one or more layers of different catalyst materials, such as a layer of molybdenum over a layer of iron, for example, although any number of layers and materials may be used. Alternately, the catalyst film 210 may comprise layers of catalyst materials overlying layers of non-catalyst materials. The non-catalyst layers may be used to control the surface properties of the catalyst layers and the growth yield of graphitic nanofilaments. The catalyst film 210 has a film thickness "$t_f$" which may range from 1 nanometer (nm) to several tens of nanometers or more.

Figure 2C:
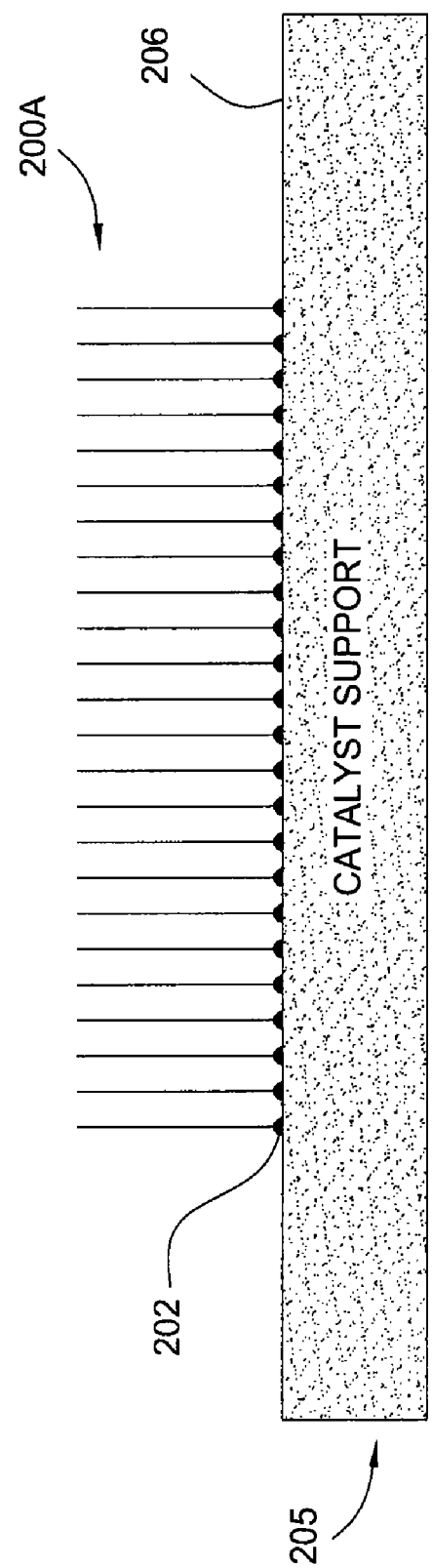
FIG. 2C is a schematic view of catalyst particles formed from the catalyst film shown in FIG. 2B.

FIG. 2C is a schematic view of catalyst particles 202 formed by further processing the catalyst film 210 shown in FIG. 2B. In one embodiment, the catalyst film 210 may be sufficiently heated so that the metallic catalyst film 210 breaks up and coalesces into catalyst particles 202. The heated catalyst film 210 may form particles due to the surface mobility and strong cohesive forces of the metal atoms. In some cases, the metallic catalyst film 210 may be said to "de-wet", and coalesce on the surface of the support material 212 or the buffer layer 213, which are part of the catalyst support 205. The catalyst particles 202 may then catalyze the growth of base-growth (base-growth nanotubes 200A are shown) or tip-growth graphitic nanofilaments. The heating or annealing of the catalyst film 210 to form the catalyst particles 202 may occur before or during the growth process. In one embodiment, the step of forming the catalyst particles 202 includes heating the metallic catalyst film 210 and catalyst support 205 to a temperature between about 20° C. and about 1000° C. in an inert, ammonia containing or hydrogen containing environment at a pressure of between about 50 Torr and about 500 Torr. In further embodiments, the temperature range may be between about 20° C. to about 300° C., and the pressure range may be between about 100-400 Torr. In general, for embodiments with a catalyst film that is greater than 10 nm thick, temperatures above about 400° C. may be required to form the particles 202, while for embodiments wherein the film is less than 10 nm thick, temperatures below 400° C. may be sufficient to form the particles 202.

The sizes of the catalyst particles 202 may be controlled by controlling the parameters of film thickness "$t_f$", temperature, and the annealing time of the catalyst film 210, although the particle sizes may follow a distribution since the coalescence process tends to be random in nature. The aforementioned parameters are typically controlled so that the catalyst particles 202 are nanometer-scale in size. Larger catalyst particles 202 may result by increasing the film thickness "$t_f$", temperature, and annealing time of the catalyst film 210 due to increased surface mobility, migration, and availability of metal catalyst atoms. The catalyst film 210 may be patterned on a surface of the catalyst support 205 using various masking, lithography, etching, or other techniques to form lines, dots, rectangles, or other patterns for the catalyst film 210, and such patterning may facilitate the controlled formation of the catalyst particles 202.

The catalyst particles 202 shown in FIG. 2C may also be formed by roughening the surface of a thick catalyst film 210. The surface roughening may be accomplished through mechanical (e.g., abrasion, plasma etching, ion bombardment) and/or electrochemical (e.g., wet etching) means to generate the catalyst particles 202. Alternately, no catalyst film 210 may be used and the catalyst particles 202 may also be formed by roughening the support surface 206 of a catalyst support 205 which comprises a catalyst material. In another method, the metal surface of the catalyst film 210 or catalyst support 205 is oxidized by heating or other means to form a porous metal oxide surface and then the metal oxide is reduced using a reducing gas (e.g., hydrogen) to form metal catalyst particles 202. The reduction of the metal oxide may occur before or during the nanofilament growth process.

Graphitic nanofilaments may also be formed using the "floating catalyst" method in which catalyst-containing materials are injected directly into a graphitic nanofilament growth chamber. The catalyst-containing materials may be injected before, during, or after the injection of a carbon source gas. The catalyst-containing materials may comprise the catalyst particles 202 or catalyst precursors from which the catalyst particles 202 are formed.

The catalyst precursors may comprise liquid catalyst mixtures, organometallic catalyst compounds, or other materials which contain catalysts. The liquid catalyst mixtures may comprise solutions, suspensions, or colloids of catalyst materials. The organometallic catalyst compounds may include but are not limited to iron pentacarbonyl, iron (II) phthalocyanine, ferrocene, nickelocene, cobaltocene, and other metallocenes. The catalyst precursors may be injected in either the gas, liquid, or solid phase using atomizers, syringe pumps, showerheads or other injecting means. After injection, the catalyst precursors may be converted into catalyst particles 202 by various means such as heating, reducing, decomposing, vaporizing, condensing, and sublimating, for example.

In the floating catalyst method, graphitic nanofilaments (e.g., reference numeral 200A in FIGS. 2A and 2C) may grow from the catalyst particle 202 as the particle falls from the top to the bottom of the growth chamber or after the catalyst particle 202 has come to rest upon a surface within the chamber. If a substrate is included within the growth chamber, many catalyst particles 202 may come to rest upon the surface of the substrate and graphitic nanofilaments may form on the substrate surface. The floating catalyst method may, under certain conditions, be used to form many densely packed and aligned graphitic nanofilaments on the surface of a substrate.

CVD Growth Parameters for Graphitic Nanofilaments

The graphitic nanofilament type (nanotube or nanofiber), structure (single-walled, multi-walled, herringbone, etc.), diameter, length and alignment may be controlled by controlling the CVD growth parameters. The growth parameters include, but are not limited to, carbon source gas, carrier gas, growth temperature, growth pressure, and growth time. For catalytic CVD growth, additional growth parameters may include catalyst parameters such as catalyst size, shape, composition, surface composition, and catalyst precursors. The parameter ranges and options for catalytic CVD growth, excluding catalyst parameters, may, in general, be applicable to the non-catalytic CVD growth of graphitic nanofilaments, although higher temperatures may be used for the non-catalytic CVD methods.

Generally, the temperatures for the catalytic CVD growth of graphitic nanofilaments may range from about 300° C. to about 3000° C., but preferably from about 500° C. to about 800° C., although temperatures lower than 600° C. may be used, especially if the CVD growth is plasma enhanced. The growth pressures may range from about 0.1 Torr to about 1 atmosphere, but more preferably from about 50 Torr to about 500 Torr, with a better growth rate of the nanotubes occurring between about 200 to about 400 Torr. In some cases, a lower or higher process pressure may be used without deviating from the scope of the invention described herein. In another embodiment, the growth pressures are above atmospheric pressure, and may range from about 1 atmosphere to about 10 atmospheres. The temperatures and pressures used during the nanotube formation process can depend in part on the type of process used to form the nanotubes. For example in embodiments where thermal CVD is used such as CVD with banks of halogen or infrared lamps, substrate temperatures may be about 800° C., while in embodiments where HWCVD is used having filament (e.g., tungsten wire) temperatures between about 1400° C. and about 1800° C., the substrate temperature is less than about 500° C. In one embodiment, a HWCVD process includes delivering the precursor gas(es) (e.g., carbon containing source) across a filament having a temperature between about 1400° C. and about 1800° C. in a processing environment that is at a pressure between about 50 Torr to about 500 Torr, and the substrate is maintained at a temperature of about 300° C. In some simplified configurations of a HWCVD chamber, the substrate is primarily heated by the heat delivered from the HWCVD filament(s), thus greatly simplifying the chamber design and complexity. Another consideration of substrate temperature, is the desired diameter of the formed nanotubes. In one embodiment, it is desirable to control the temperature to the lower end of the range (e.g., <500° C.) since it has been found that lower substrate temperatures result in smaller diameter tubes, which provide a greater surface area to volume ratio, which is attractive in many applications. The growth time or "residence time" depends in part on the desired graphitic nanofilament length, with longer growth times producing longer lengths. The growth time may range from about ten seconds to many hours, but more typically from about ten minutes to several hours.

The carbon containing source gas used for graphitic nanofilament growth may include a compound selected from a group consisting of alkanes, alkenes alkynes, aromatic hydrocarbons, oxygenated hydrocarbons, low-molecular-weight hydrocarbons, or combinations thereof. For example, the carbon containing source gas may include, but is not limited to ethylene, xylene, propylene, acetylene, benzene, toluene, ethane, methane, butane, propane, hexane, methanol, ethanol, propanol, isopropanol, carbon monoxide, or acetone. In general, the carbon source gas may comprise any carbon-containing gas or gases, and the carbon source gas may be obtained from liquid or solid precursors for the carbon-containing gas or gases. An auxiliary gas may be used with the carbon source gas to facilitate the growth process. The auxiliary gas may comprise one or more gases, such as carrier gases, inert gases, reducing gases (e.g., hydrogen, ammonia), dilution gases, or combinations thereof, for example. The term "carrier gas" is sometimes used in the art to denote inert gases, reducing gases, and combinations thereof. Some examples of carrier gases are hydrogen, nitrogen, argon, and ammonia.

Composite Material Formation Apparatus

Figure 3:
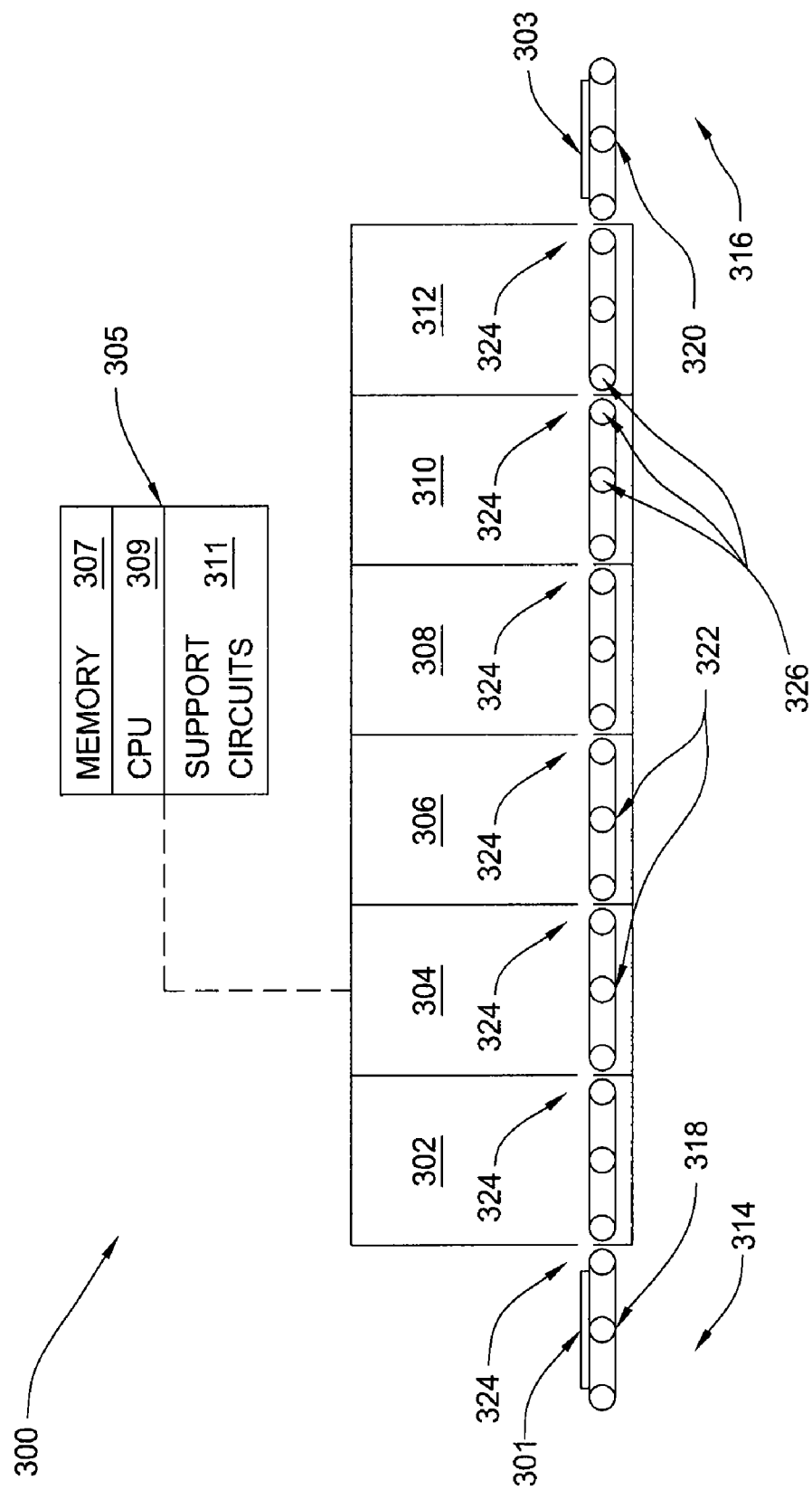
FIG. 3 is a schematic side view of one embodiment of an apparatus for forming composite materials on large area substrates in the form of discrete substrates, showing the various chambers for forming the composite materials.

FIG. 3 is a schematic side view of one embodiment of an apparatus 300 for forming composite materials on discrete substrates 301, wherein the apparatus 300 has various chambers 302, 304, 306, 308, 310 and 312 that are used to form the composite materials on the substrates 301. The apparatus 300 has a first end 314 where substrates 301 enter the apparatus 300, and a second end 316 where substrates 303 with composite materials deposited thereon, exit the apparatus 300. At the first end 314 an input conveyor 318 supports and guides substrates 301 into the first chamber 302. At the second end 316, an exit conveyor 320 receives substrates 303 from the final chamber 312. A series of substrate transfer ports 324 are provided at the entrance and exit of the apparatus and between each of the chambers 302, 304, 306, 308, 310 and 312 to allow the substrates to pass between chambers, while maintaining the required environment within each chamber during processing. Details of the ports 324 are described below with reference to chamber 302. A series of intermediate conveyors 322 support and guide the substrates through the various chambers. While the conveyor system has been shown with a number of individual conveyors 318, 320 and 322, a single conveyor with a continuous web of material may be used. In one configuration, the conveyors include support rollers 326 that support and drive the web(s) of material. When individual conveyors 318, 320 and 322 are used, the rollers 326 may be mechanically driven by a common drive system (not shown) such that they are moved in unison, or individually. The various drives for the rollers 326, ports 324 and other system actuators are provided by control signals from a system controller 305. While in the embodiment illustrated in FIG. 3, has six chambers, this is not intended to be limiting as to the scope of the invention, since any number of chambers may be provided depending on the number of processes and the required equipment for each process. In one embodiment, the apparatus 300 also contains at least one additional chamber (not shown) at either end 314, 316 of the system that acts as a load lock to provide a buffer between the environment external to the apparatus 300 and the processing regions of the chambers 302-312.

The controller 305, used to control the various components in the apparatus 300, generally has a memory 307, a central processing unit (CPU) 309 and support circuits 311. The controller 305 is utilized to control the process sequence of the chambers, regulating the gas flows from gas sources and power application from power sources into the chambers. The CPU 309 may be of any form of a general purpose computer processor that can be used in an industrial setting. The software routines can be stored in the memory 307, such as random access memory, read only memory, floppy or hard disk drive, or other form of digital storage. The support circuits 311 are conventionally coupled to the CPU 309 and may comprise cache, clock circuits, input/output subsystems, power supplies, and the like. The software routines, when executed by the CPU 309, transform the CPU into a specific purpose computer (controller) 305 that controls the process chambers such that the processes are performed in accordance with the present invention. The software routines may also be stored and/or executed by a second controller (not shown) that is located remotely from the apparatus 300.

Figure 4A:
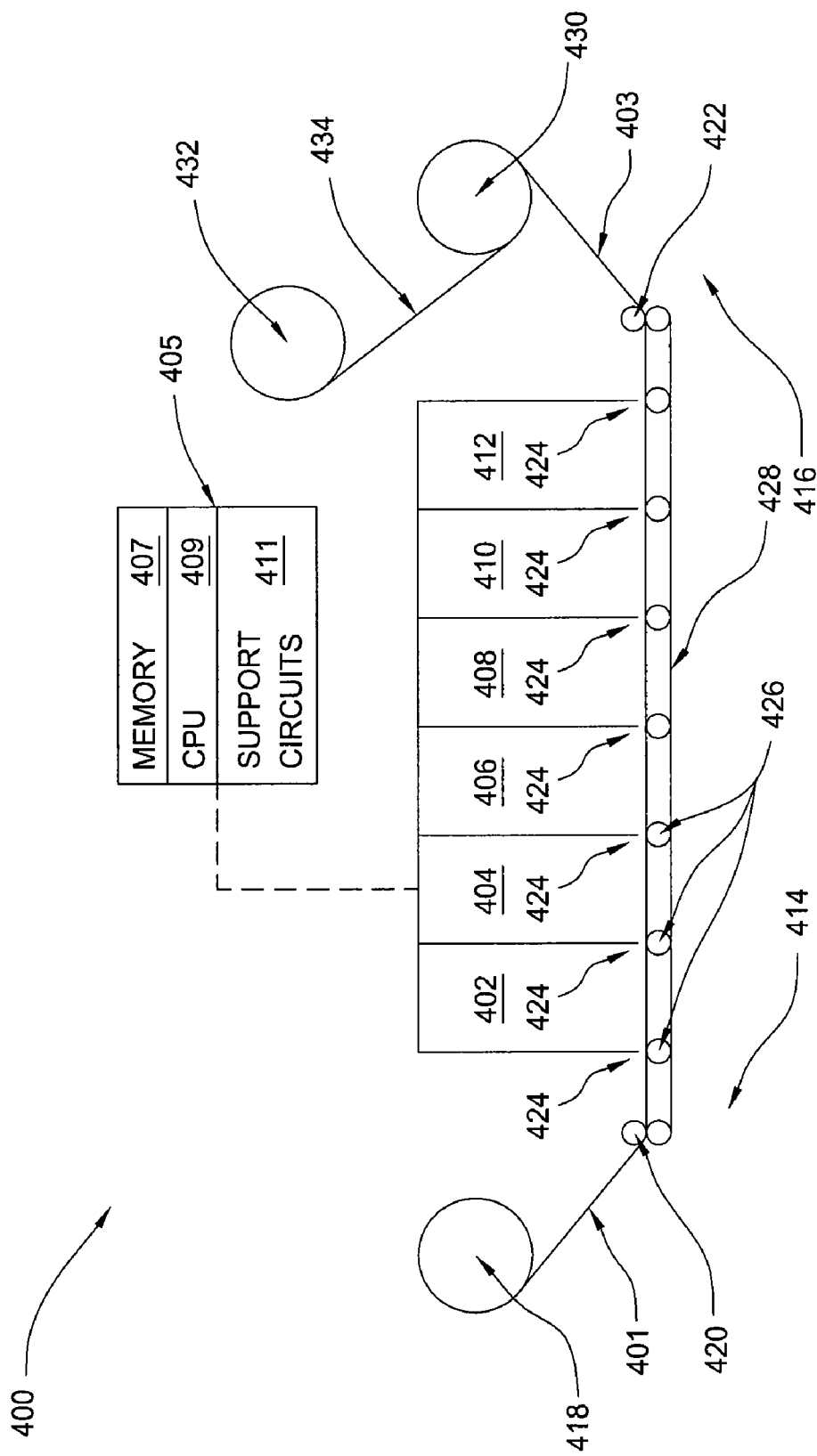
FIG. 4A is a schematic side view of one embodiment of an apparatus for forming composite materials on large area substrates in the form of a continuous web, showing the various chambers for forming the composite materials.

FIG. 4A is a schematic side view of one embodiment of an apparatus 400 for forming composite materials on large area substrates. The substrate(s) in FIG. 4A is in the form of a continuous web 401 of material. As with apparatus 300, apparatus 400 includes various chambers 402, 404, 406, 408, 410 and 412, for forming the composite materials. The apparatus 400 has a first end 414 where a supply roll 418 stores the unprocessed substrate(s), web 401, and feeds the web 401 into the first chamber 402. The apparatus 400 has a second end 416 where a take-up roll 430 receives and stores the processed substrate(s), web 403, with composite materials deposited thereon. At the first end 414 a first diverter roller 420 receives web 401 from the supply roll 418, and diverts the web 401 into the first chamber 402. At the second end 416, a second diverter roller 422 receives the processed web 403 from the final chamber 412 and diverts it to the take-up roll 430. In some embodiments, a roll 432 of a protective web of material 434 may be routed unto take-up roll 430. The web of protective material 434 isolates adjacent layers of processed web 403, to thereby protect the web 403 while it is stored and or transported on roll 430.

A series of substrate transfer ports 424 are provided at the entrance and exit of the apparatus 400 and between each of the chambers 402, 404, 406, 408, 410 and 412 to allow the substrates to pass between chambers, while maintaining the required environment within each chamber during processing. Details of the ports 424 are described below with reference to FIGS. 4B-4D. A series of rollers 426 supports the web 401 of material as it is guided through the various chambers. In some embodiments, a drive belt 428 may be included to form a conveyor to provide additional support to the web 401 between the rollers 426. The rollers 426 may be mechanically driven by a common drive system (not shown) such that they are controlled in unison, thereby avoiding wrinkling or stretching of the web 401. While in the embodiment of FIG. 4A, six chambers are shown, more or fewer chambers may be provided depending on the number of processes and the required equipment for each process. In one embodiment, the apparatus 400 also contains at least one additional chamber (not shown) at either end 414, 416 of the system that act as a load lock to provide a buffer between the environment external to the apparatus 400 and the processing regions of the chambers 402-412. The various drives for the supply roll 418, take-up roll 430, rollers 426, ports 424 and other system actuators are provided by control signals from a system controller 405. The controller 405 has a memory 407, a central processing unit (CPU) 409 and support circuits 411 that are coupled to the apparatus 400. The controller 405 is utilized to control the process sequence of the chambers, regulating the gas flows from gas sources and power application from power sources into the chambers. The CPU 409 may be of any form of a general purpose computer processor that can be used in an industrial setting. The software routines can be stored in the memory 407, such as random access memory, read only memory, floppy or hard disk drive, or other form of digital storage. The support circuits 411 are conventionally coupled to the CPU 409 and may comprise cache, clock circuits, input/output subsystems, power supplies, and the like. The software routines, when executed by the CPU 409, transform the CPU into a specific purpose computer (controller) 405 that controls the process chambers such that the processes are performed in accordance with the present invention. The software routines may also be stored and/or executed by a second controller (not shown) that is located remotely from the apparatus 400.

FIGS. 4B-4D show several embodiments of the substrate transfer ports 424 that may provided between the various chambers 402, 404, 406, 408, 410 and 412 and/or at the entrance and exit of the apparatus 400. In a first embodiment, as shown in FIG. 4B, the substrate transfer port 424 is closeable and is mounted on the chamber wall 440. A closeable door 442 is sealed with the wall and captures the web 401 between the door 442 and a support roller 426. The end of the door 442 that contacts the web 401 may include an elastomeric strip 446 or other similar compliant element that will reduce damage to the web 401 and to provide an effective seal. An actuator 444, extends and retracts the door 442, based on commands from a system controller 405. When the door 442 is in the closed position as shown in FIG. 4B, a sealed chamber is formed between the chamber walls 440, the top of the chamber (e.g., reference numeral 502 shown and described below), and the web 401, which forms the bottom of the chamber, in some embodiments. After the process associated with the chamber is performed, the door 442 is opened and the web 401 is advanced for the length of the chamber. The door 442 can then be reclosed and the process performed on another length of the web 401.

Another embodiment of the substrate transfer ports 424 is shown in FIG. 4C. In this embodiment, the bottom of the wall 440 of the chamber includes two longitudinal extensions 448. The extensions 448 form a gap G between themselves and the web 401. The gap G extends for a length L as shown in FIG. 4C. The height of the gap G and the length L of the gap are chosen based on relative pressure and temperature differences between adjacent chambers and are thus chosen according to these specifications. In general, a large length to height ratio allows the gap G to function as a restriction, reducing the transfer of processing gases into and out of the chambers. In a further embodiment, as shown in FIG. 4D, a number of vacuum ports 450 are provided, proximate to the center of the bottom of wall 440. A vacuum line 452 routes vacuum ports 450 to a source of vacuum 454 via valve 456. Valve 456 is controlled by signals received from the support circuits 411 (FIG. 4A) of the system controller 405. The vacuum ports 450 evacuate any gases in the gap region by providing airflow as shown by the arrows labeled "Gas" in FIG. 4D. By removing the gases in the gap region, the transfer of gases between chambers is reduced. It should be noted that one advantage of the embodiments of the transfer ports 424 as shown in FIGS. 4C and 4D, over embodiments requiring a door, such as the one shown in FIG. 4B, is that the processes in each chamber can be performed continuously (i.e., web 401 is fed continuously through the system). There are many types of chamber isolation systems in use in deposition processes, and the particular isolation system used should not be considered limiting with respect to the present invention.

Figure 21:
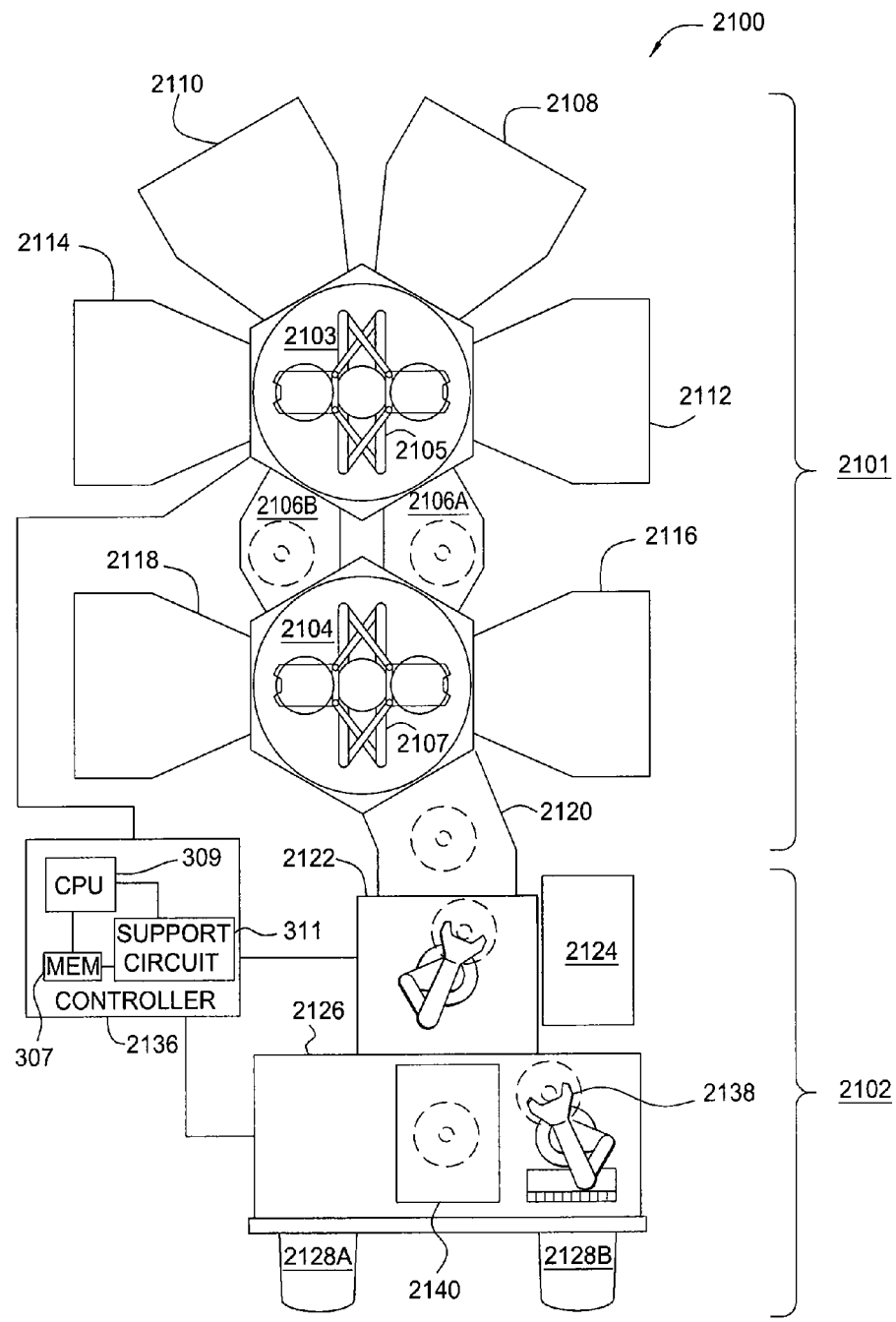
FIG. 21 is a schematic plan view of a further embodiment of an apparatus for forming composite materials on large area substrates in the form of discrete substrates, showing the various chambers for forming the composite materials.

FIG. 21 depicts a schematic diagram of a further embodiment of a substrate processing system (e.g., cluster tool 2100) used to deposit a composite material on a substrate. The cluster tool 2100 includes a vacuum-tight processing platform 2101, a factory interface 2102, and a system controller 2136. The platform 2101 comprises a plurality of chambers 2108, 2110, 2112, 2114, 2116, 2118 and at least one load-lock chamber (a load-lock chamber 2120 is shown), which are coupled to vacuum substrate transfer chambers 2103, 2104. The factory interface 2102 is coupled to the transfer chamber 2104 by the load lock chamber 2120.

In one embodiment, the factory interface 2102 comprises at least one docking station 2126, at least one substrate transfer robot 2138, at least one substrate transfer platform 2140, at least one precleaning chamber 2124, and a precleaning robot 2122. In one embodiment, the docking station 2126 is configured to accept at least one front opening unified pod (FOUP). Two FOUPs 2128A, 2128B are shown in the embodiment of FIG. 1, but any number of FOUPs may be provided within the physical limits of the docking station 2126. The substrate transfer robot 2138 is configured to transfer the substrate from the factory interface 2102 to the precleaning chamber 2124 wherein a precleaning process may be performed. The precleaning robot 2122 is configured to transfer the substrate from the precleaning chamber 2124 to the loadlock chamber 2120. Alternatively, the substrate may be transferred from the factory interface 2102 directly to the loadlock chamber 2120, by-passing the precleaning chamber 2124.

The loadlock chamber 2120 has a first port coupled to the factory interface 2102 and a second port coupled to a first transfer chamber 2104. The loadlock chamber 2120 is coupled to a pressure control system (not shown) which pumps down and vents the chamber 2120 as needed to facilitate passing the substrate between the vacuum environment of the transfer chamber 2104 and the substantially ambient (e.g., atmospheric) environment of the factory interface 2102.

The first transfer chamber 2104 has a first robot 2107 disposed therein. The first robot 2107 transfers substrates between the loadlock chamber 2120, the processing modules 2116 and 2118, and two substrate transfer platforms 2106A and 2106B. The second transfer chamber 2103 has a second robot 2105 disposed therein. The second robot 2105 transfers substrates between the two substrate transfer platforms 2106A and 2106B and the chambers 2108, 2110, 2112 and 2114. The two substrate transfer platforms 2106A, 2106B are disposed between the transfer chamber 2104 and the transfer chamber 2103 to facilitate transfer of the substrate between the robot 2105 and the robot 2107. The platforms 2106A, 2106B can either be open to the transfer chambers 2103, 2104 or be selectively isolated (i.e., sealed) from the transfer chambers 2103, 2104 to allow different operational pressures to be maintained in each of the transfer chambers 2103, 2104.

In one embodiment, the processing chambers coupled to the first transfer chamber 2104 may be a physical vapor deposition (PVD) chamber 2118 and a chemical vapor deposition (CVD) chamber 2116, for performing a CVD process such as hot-wire CVD (HWCVD). The processing chambers coupled to the second transfer chamber 2103 may be a second PVD chamber 2114, a HWCVD chamber 2110, a third PVD chamber 2108, and a degas chamber 2112. Suitable CVD, PVD, HWCVD and degas processing chambers are available from Applied Materials, Inc., located in Santa Clara, Calif.

The system controller 2136, which may be similar to the system controller 305 described above, is coupled to the integrated cluster tool 2100. The system controller 2136 controls the operation of the cluster tool 2100 using a direct control of the process chambers of the cluster tool 2100 or alternatively, by controlling the computers (or controllers) associated with the process chambers and cluster tool 2100. In operation, the system controller 2136 enables data collection and feedback from the respective chambers and system to optimize performance of the cluster tool 2100. The software routines, such as an electrode deposition process 2300 described below with reference to FIG. 23, when executed by the CPU 309, transform the CPU into a specific purpose computer (controller) 2136. The software routines may also be stored and/or executed by a second controller (not shown) that is located remotely from the cluster tool 2100.

Figure 22:
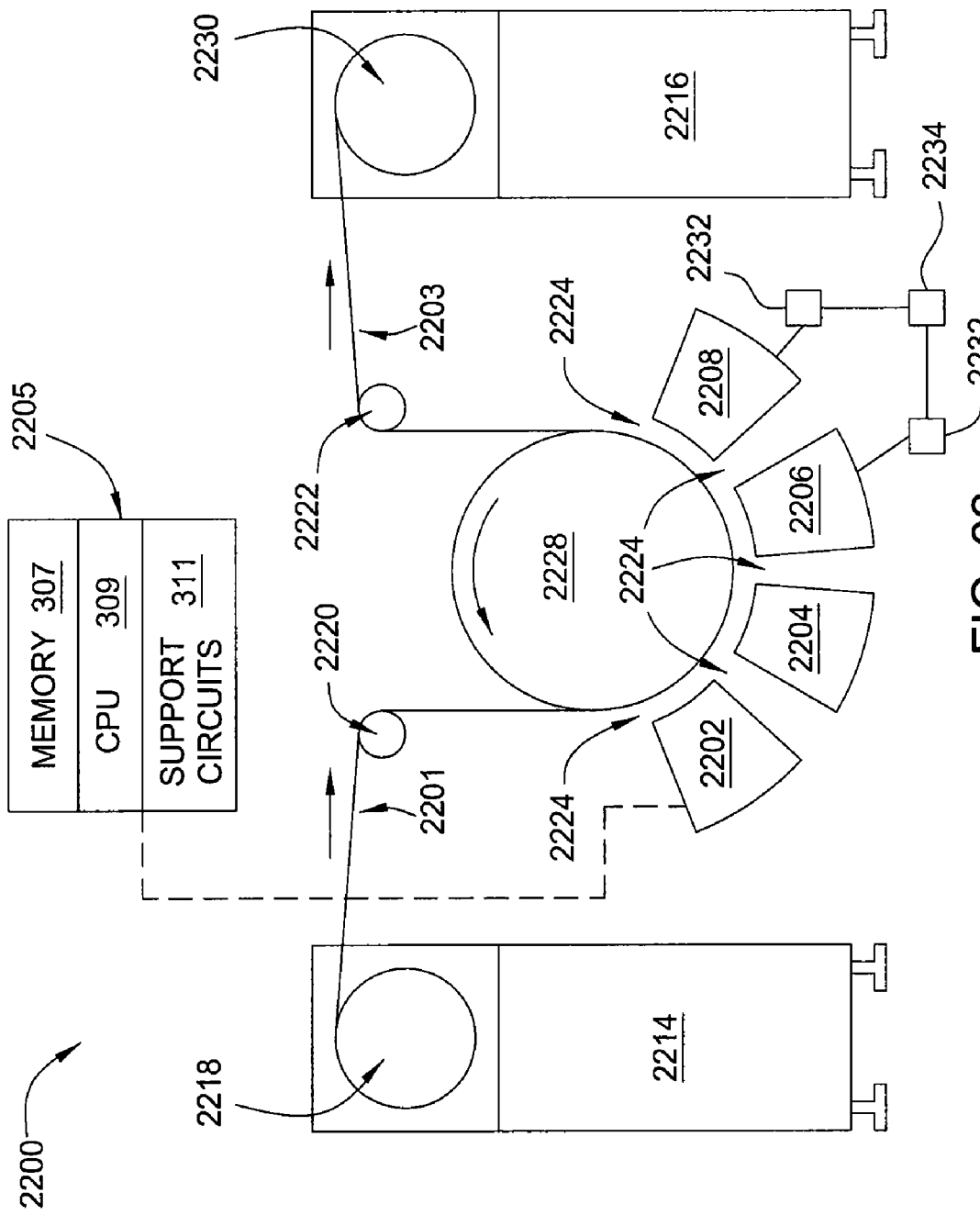
FIG. 22 is a schematic side view of a further embodiment of an apparatus for forming composite materials on large area substrates in the form of a continuous web, showing the various chambers for forming the composite materials.

FIG. 22 is a schematic side view of a further embodiment of an apparatus 2200 for forming composite materials on large area substrates. The substrate(s) in FIG. 22 is in the form of a continuous web 2201 of material. As with apparatus 300 and 400, the apparatus 2200 includes various chambers 2202, 2204, 2206 and 2208, that are used to form the composite materials on the continuous web 2201. The apparatus 2200 has a supply cabinet 2214 with a supply roll 2218 that stores the unprocessed substrate(s), or web 2201. The apparatus 2200 has a take-up cabinet 2216 with a take-up roll 2230 that receives and stores the processed substrate(s), or web 2203, that has the composite materials deposited thereon. The supply roll 2218 feeds the web 2201 to a first diverter roller 2220 which diverts the web 2201 onto a rotating drum 2228. The un-processed web 2201 is then supported and transferred through the various chambers 2202, 2204, 2206 and 2208 by use of the rotating drum 2228. In this configuration, the rotating drum 2228 is used to deposit or process portions of the web 2201 as they pass through each respective chamber 2202, 2204, 2206 and 2208. As the processed web 2203 leaves the rotating drum 2228, a second diverter roller 2222 receives the processed web 2203 and diverts it to the take-up roll 2230. In some embodiments, a roll of a protective web of material may be routed unto take-up roll 2230, as shown with respect to apparatus 400. The web of protective material isolates adjacent layers of processed web 2203, to thereby protect the web 2203 while it is stored and or transported on roll 2230.

In addition to diverting the substrate, web 2201, 2203, the first diverter roller 2220 and the second diverter roller 2222, hold the web against the rotating drum 2228, as the web is fed through the chambers 2202, 2204, 2206 and 2208. The rotating drum 2228 provides support to the web as it undergoes processing in the chambers of apparatus 2200. The drum 2228 may, in one embodiment, provide temperature control to at least a portion of the web. For example the drum 2228 may be chilled to reduce or maintain the temperature of the web, or may be heated to increase or maintain the temperature of the web. To provide the temperature control, cooling or heating fluid may be circulated within the drum 2228 or through passages (not shown) internal to the drum 2228.

A series of substrate transfer ports 2224 are provided at the entrance of the chamber 2202 and the exit of the chamber 2208 and between each of the chambers 2202, 2204, 2206 and 2208 to allow the web to pass between chambers, while maintaining the required environment within each chamber during processing. Details of some embodiments of the ports 2224 are described above with reference to ports 424 in FIGS. 4B-4D. It should be understood that the longitudinal extensions 448 of the embodiments of ports 424 shown in FIGS. 4C and 4D, may be curved to conform to the curvature of drum 2228, when used in the apparatus 2200. The supply roll 2218, the take-up roll 2230, the diverter rollers 2220 and 2222, as well as drum 2228 may be mechanically driven by a common drive system (not shown) such that their movement is in unison, thereby avoiding wrinkling or stretching of the web 2201.

While in the embodiment of FIG. 22, four chambers are shown, more or fewer chambers may be provided depending on the number of processes and the required equipment for each process. In one embodiment, the chamber 2202 is a PVD chamber, the chamber 2204 is an anneal chamber and the chambers 2206 and 2208 are HWCVD chambers. In one embodiment, one or more of the chambers 2202-2208 are similar to the chambers 302-312 discussed above. Further in some embodiments, the apparatus 2200 also contains at least one additional chamber (not shown) at either end of the system that act as a load lock to provide a buffer between the environment external to the chambers 2202-2208 and the processing regions of the chambers 2202-2208. To control the pressure in one or more of the chambers 2202-2208, each chamber may be separately connected to one or more vacuum sources 2234 through a flow control valve 2232. For example, as shown in FIG. 22, the chambers 2206 and 2208 are connected to a single vacuum source 2234.

The various drives for the supply roll 2218, take-up roll 2230, rollers 2220 and 2222, drum 2228, ports 2224 and other system actuators are provided control signals from a system controller 2205. The controller 2205, which may be similar to the controller 305 discussed above, may contain a memory 307, a central processing unit (CPU) 309 and support circuits 311 that are coupled to the apparatus 2200. The controller 2205 is utilized to control the process sequence of the chambers, regulating the gas flows from gas sources and power application from power sources into the chambers. The software routines, when executed by the CPU 309, transform the CPU into a specific purpose computer (controller) 2205 that controls the process chambers such that the processes are performed in accordance with the present invention. The software routines may also be stored and/or executed by a second controller (not shown) that is located remotely from the apparatus 2200.

With respect to the above apparatus 300, 400, 2100 and 2200, it should be understood that the various components of the chambers of each of these apparatus are useable within the chambers of the other apparatus. The components shown in FIGS. 5A-11 and described below with respect to chambers 302, 302', 304, 306, 800, 308, 310 and 312, are also capable of being incorporated into the chambers of apparatus 400, 2100 and 2200. Likewise, the components shown in FIGS. 12 and 13 and described below with respect to chambers 1200 and 1300, are also capable of being incorporated into the chambers of apparatus 300, 2100 and 2200. The different composite materials and methods of making these materials can each be formed or performed in any of the above described apparatus 300, 400, 2100 and 2200. Further, the formation of these composite materials may also be accomplished by performing some steps in one type of apparatus, while performing other steps in another type of apparatus.

Figure 5A:
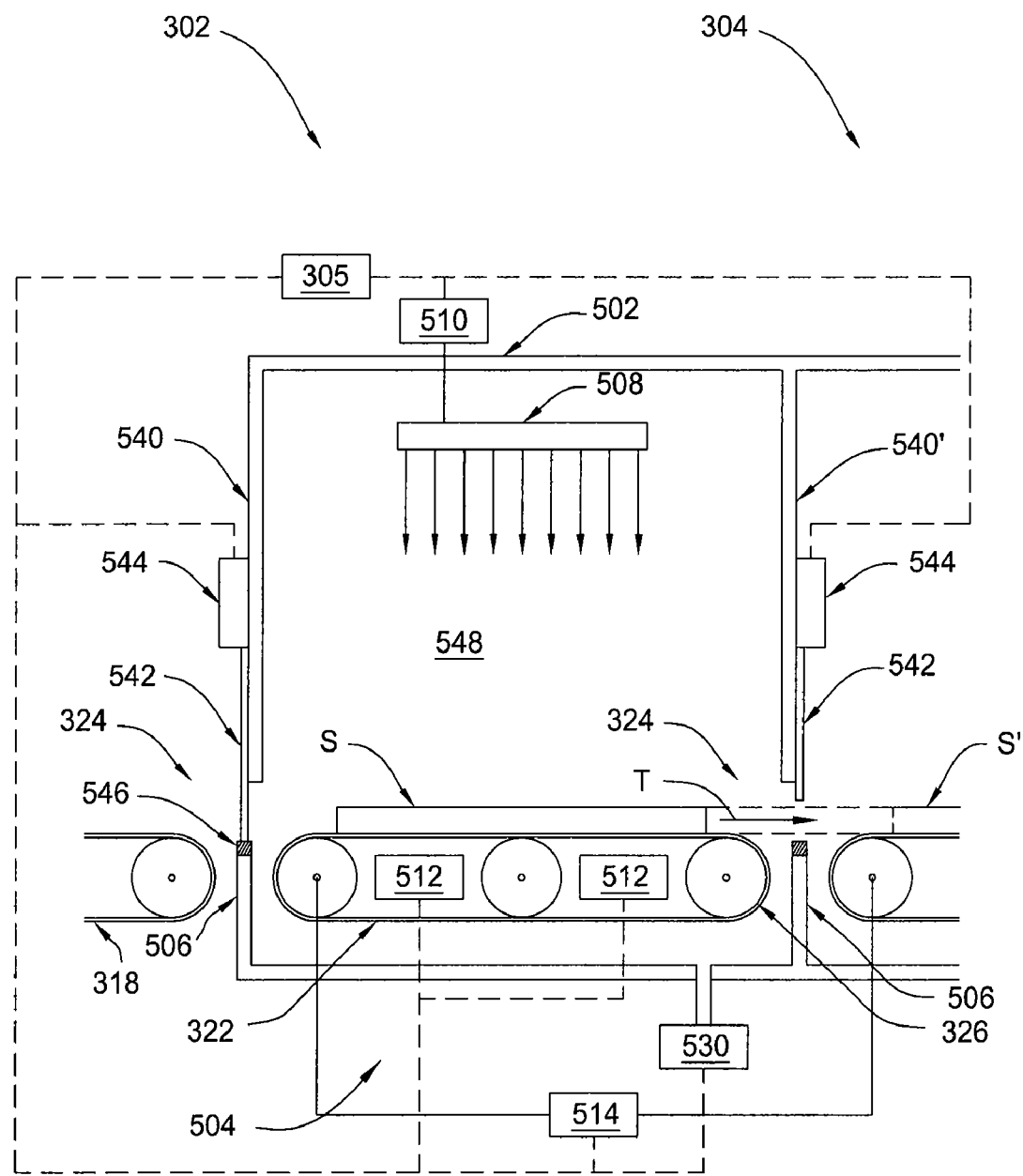
FIG. 5A is a schematic side view of one embodiment of a chamber for depositing catalyst material on substrates.

FIG. 5A shows a schematic side view of one embodiment of a chamber 302 for depositing catalyst material on a substrate S. In this embodiment, the chamber 302 includes a first wall 540 facing the first end 314 of apparatus 300 and a second wall 540' between chamber 302 and chamber 304 (see FIG. 3). While second wall 540' is shown as a shared wall between chambers 302 and 304, double walls may be used to provide greater insulation between chambers. Chamber 302 also includes a top 502, that may be a common one-piece top for all of the chambers as shown, or each chamber could be provided with a separate top. FIG. 5A also illustrates a further embodiment of substrate transfer ports 324 that are positioned on the walls 540 and 540'. Walls 540 and 540' include a lower portion 506 that connects to the chamber bottom 504, below the substrate transfer ports 324. As with the top 502, chamber bottom 504 may be a common one-piece bottom for all of the chambers as shown, or each chamber could be provided with a separate bottom.

Each of the substrate transfer ports 324 as shown in FIG. 5A, is generally closeable and is mounted on the chamber wall. A closeable door 542 is sealed with the wall and contacts an elastomeric strip 546 on top of the lower portion 506 of the wall to seal the substrate transfer port 324. An actuator 544, extends and retracts the door 542, based on commands received from the support circuits 311 (FIG. 3) of the system controller 305. When the door 542 is in the closed position as shown on the left in FIG. 5A, the chamber 302 is sealed so that regions on either side of the door 542 are isolated from each other. In one embodiment, the door 542 is a conventional gate valve that is configured to prevent gas leakage through the substrate transfer port 324. During processing the doors 542 are closed so that a processing region 548 is formed between the chamber walls 540, the top 502 of the chamber, and the chamber bottom 504 and doors 542 so that one or more substrate processing steps may be performed therein. After the process associated with each chamber is performed, the doors 542 of each chamber are opened as shown on the right side of FIG. 5A. The conveyors 322 (as well as the input conveyor 318 and the exit conveyor 320) advance the substrates "S" in the direction "T" into the subsequent chamber, based on commands received by a drive mechanism 514 from the support circuits 311 (FIG. 3) of the system controller 305, as shown for example by substrate S'. The doors 542 can then be reclosed and the appropriate processes performed on the substrates S. It should be noted that other embodiments of substrate transfer ports, such as those shown in FIGS. 4C and 4D may also be used in conjunction with chamber 302 or any of the other chambers of apparatus 300, 400 or 2200.

In one embodiment, a pumping device 530 is coupled to the processing region 548 to evacuate and control the pressure therein. The pumping device 530 may be a conventional rough pump, roots blower, turbo pump or other similar device that is adapted control the pressure in the processing region 548. In one embodiment, the pressure level of the processing region 548 of the chamber 302 may be maintained at less than about 760 Torr. In one embodiment, the pressure level of the processing region 548 of the chamber 304 may be maintained at about 1 Torr or less. In another embodiment, the pressure level within the chamber 302 may be maintained at about $10^{-3}$ Torr or less. In yet another embodiment, the pressure level within the chamber 302 may be maintained at about $10^{-3}$ Torr to about $10^{-7}$ Torr.

FIGS. 15A-15G are schematic side views showing the various stages of one embodiment of a method for forming graphitic nanofilament based composite materials. FIG. 18 illustrates a process sequence 1800 used to form the composite materials on a substrate S. The sequence found in FIG. 18 corresponds to the stages depicted in FIGS. 15A-15G, which are discussed herein. The composite materials may be formed on a number of discrete substrates S as shown in FIG. 5A, or a web 401, 2201 as shown in FIGS. 4A and 22, respectively. Such a substrate S is shown in FIG. 15A. The substrate S can be made of, but is not limited to, glass, silicon (Si) or metal such as aluminum (Al), stainless steel, or copper (Cu). The substrate S may be relatively non-flexible when provided as individual substrates, but is relatively flexible when supplied as a web 401 or 2201 (for example, aluminum, stainless steel, or copper foil).

At step 1802, as shown in FIGS. 5A-5B, 15B and 18, a substrate S is positioned in the processing chamber 302 and a layer 1502 of catalytic material is deposited on the substrate S. The layer 1502 of catalytic material can be formed of, but is not limited to, iron (Fe); cobalt (Co); nickel (Ni); alloys of Fe, Co and Ni; Fe polymer; Co polymer; and Ni polymer. The layer 1502 of catalytic material may be deposited on the substrate S using a number of methods including a physical vapor deposition (PVD) method such as sputtering, or a chemical vapor deposition (CVD) method, as described above. In one embodiment, the layer 1502 of catalytic material is deposited to a thickness of about 0.2 nm to about 20 nm. In one embodiment, the layer 1502 of catalytic material is deposited to a thickness of less than about 20 nm.

In one embodiment, a chamber 302 of FIG. 5A, is configured and adapted to deposit the layer 1502 of catalyst material on a substrate S during step 1802, using a sputtering deposition process. A target 508 of the catalyst material is provided in the chamber 302. A power source 510 is connected to the target 508 so that a cathodic DC and/or RF bias can be applied to the target 508 so that the catalytic material can be deposited on the surface of the substrate S. The plasma generated by the bias applied to the target 508 causes atoms from the target surface to be removed, and be deposited on the exposed surfaces of the substrate S. In embodiments requiring heating of the substrates, one or more heating elements 512 may be provided. The heating elements 512 may comprise resistive heating elements, induction coils, or other heating means. In batch-type systems, once the layer 1502 of catalytic material is deposited on the substrate S, (and the other chambers' processes are complete as described below), the doors 542 of the chambers are opened and the substrates are advanced to the next chamber in the fabrication process. In continuous systems, the speed of the conveyors 322 are maintained to provide the correct residence time within the chamber 302, to deposit the required thickness of layer 1502, such as about 0.2 nm to about 20 nm, as described above. Some examples of the materials used to form the catalytic layer include iron (Fe), nickel (Ni), cobalt (Co), iron nickel alloys (FeNi) and iron cobalt alloys (FeCo). Suitable precursors include ferrocene, nickelocene and cobaltocene. The catalyst may be deposited using PVD sputtering, evaporation, vapor phase CVD or sol gel methods.

Figure 5B:
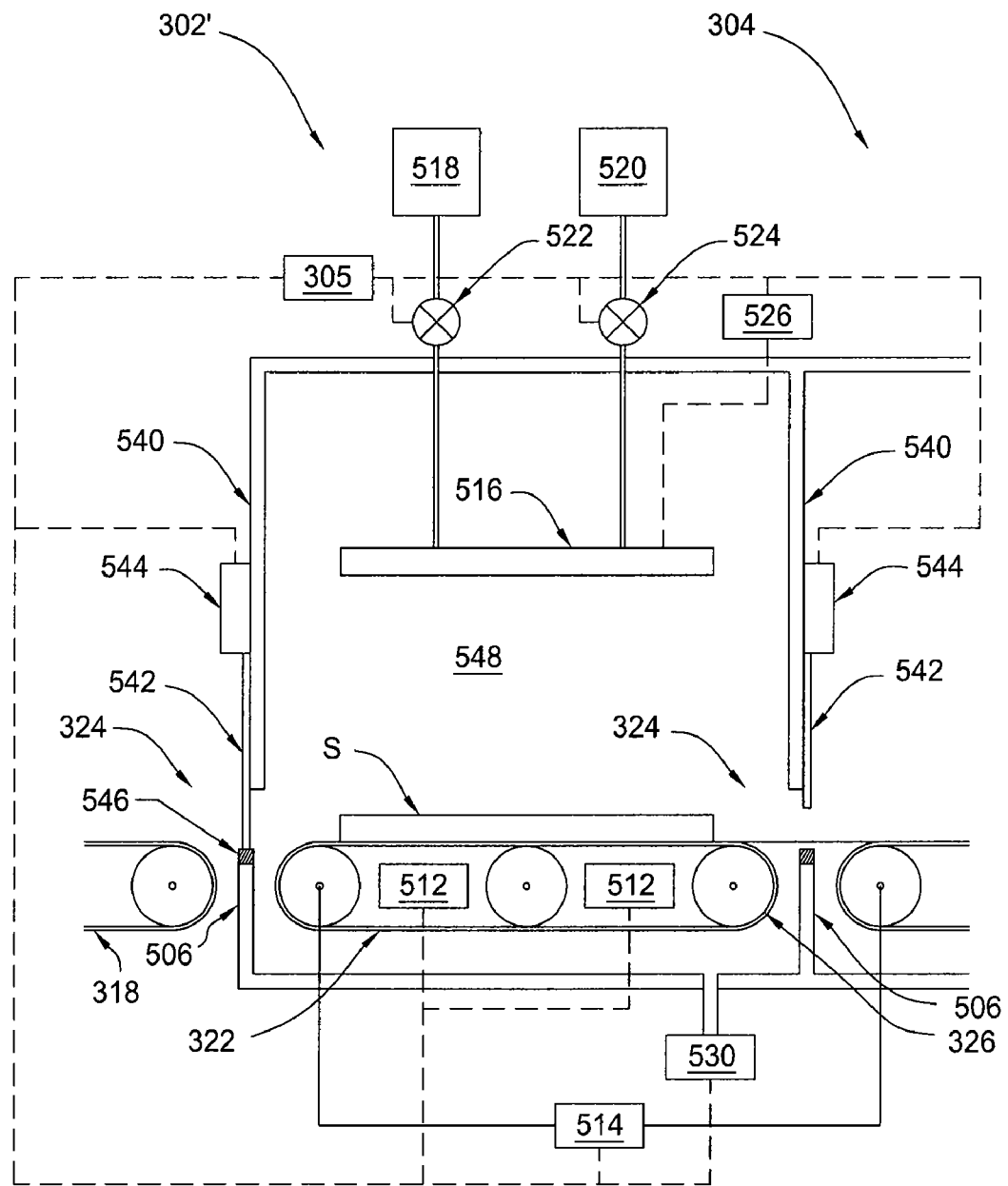
FIG. 5B is a schematic side view of another embodiment of a chamber for depositing catalyst material on substrates.

In another embodiment, during step 1802, a chamber 302' of FIG. 5B is used to deposit catalyst material on the substrates S using a chemical vapor deposition (CVD) process. One will note that the components found in chamber 302' (and the other chambers as described below) are generally similar to the components founds in chamber 302 in FIG. 5A, and thus have the same reference designators, and are not described with reference to FIG. 5B. In chamber 302', process gases are provided to a showerhead 516 from one or more gas sources 518, 520 via valves 522, 524, respectively. Valves 522, 524 are controlled by signals received from the support circuits 311 of the system controller 305. The process gases provided to the showerhead 516 include gases used to form the catalytic material, such as metal organic precursors. While in this embodiment, two gas sources 518, 520 are shown, a single gas source or a plurality of gas sources may be provided depending on the number and combination of gases used. To improve the film quality, increase the deposition rate and/or film uniformity, the CVD process may be enhanced by applying a bias to the showerhead 516 and/or substrate S. In one embodiment, a power supply 526 is configured to RF bias the showerhead 516 based on signals received from the support circuits 311 of the system controller 305. The applied voltage may be RF, DC or AC depending on system requirements. In another embodiment, an inductively coupled plasma may also be formed in the processing region 548 by use of the power supply 526 and one or more coils (not shown) which are positioned to generate a plasma therein.

Figure 6:
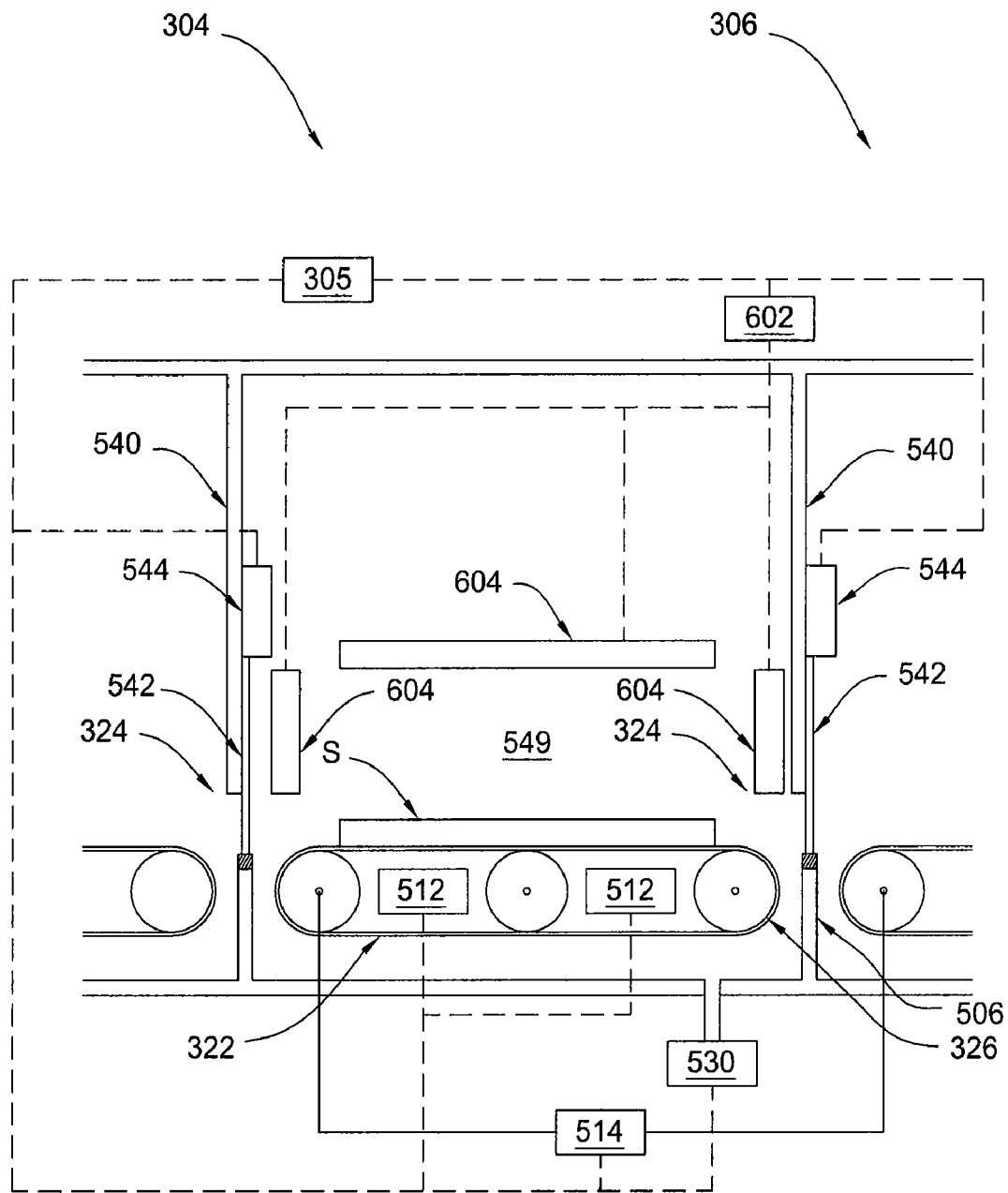
FIG. 6 is a schematic side view of one embodiment of a chamber for heating the catalyst material to form nanoislands of catalyst material on substrates.
Figure 7:
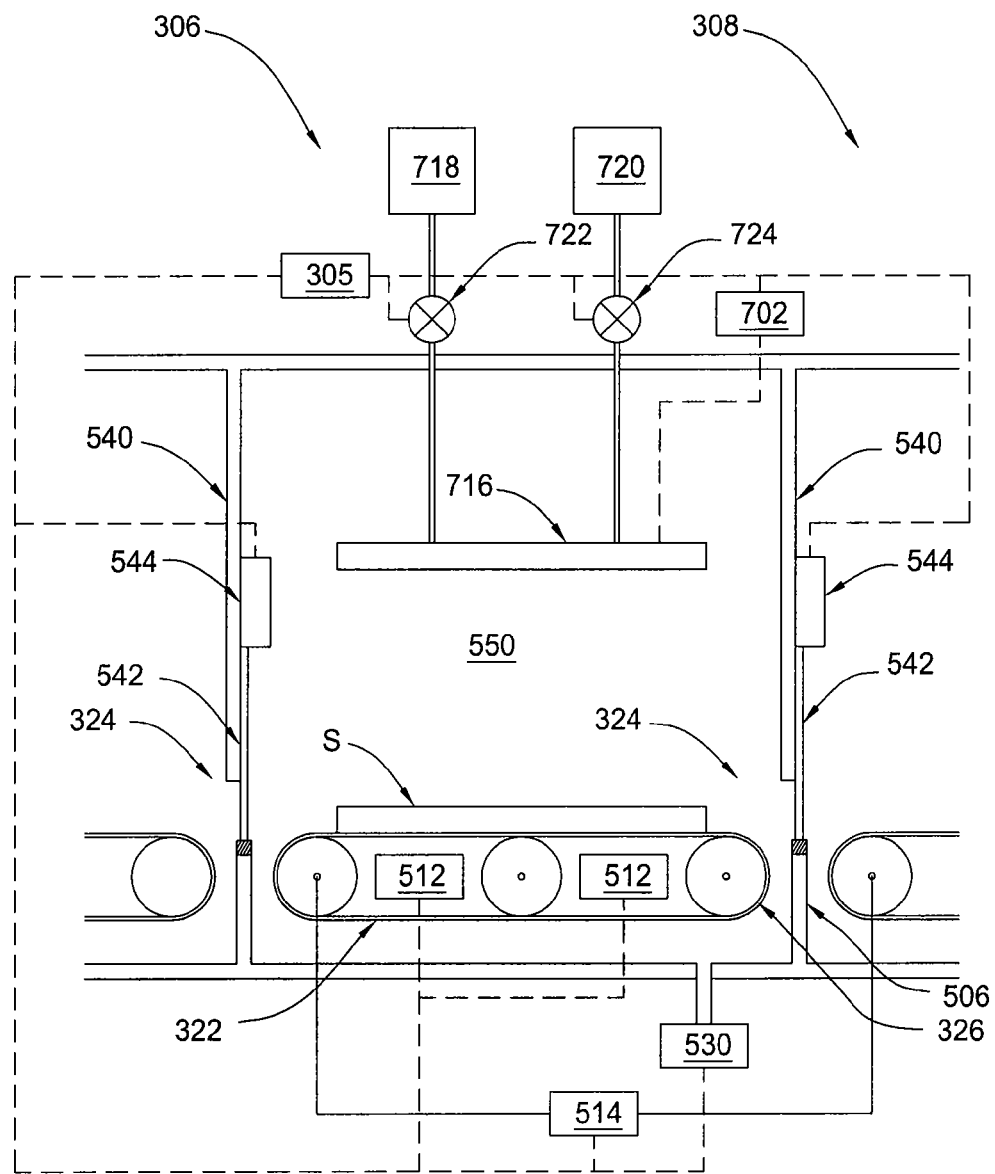
FIG. 7 is a schematic side view of one embodiment of a chamber for forming nanotubes on substrates.

Next, during step 1804, as illustrated in FIGS. 15C and 18, the deposited catalyst material layer 1502 is further processed to form nanoislands 1504 of catalyst material on the substrate S. In one embodiment, the processing step(s) used to form the nanoislands 1504 includes heating the substrate S to a desired temperature for a desired period of time. In one embodiment, as shown in FIG. 6, a chamber 304 is configured and adapted to heat the catalyst material to form nanoislands 1504 of catalyst material on a substrate S. To assist in heating, chamber 304 may include the additional heaters 604 in addition to the heater elements 512 that are similarly configured as shown in FIG. 5A. The additional heaters 604 may comprise resistive heating elements or radiant heat lamps that are positioned to uniformly heat the substrate S disposed in the processing region 549 formed in the chamber 304. A heater power supply 602 receives control signals from the support circuits 311 of the system controller 305, to control the amount of heat delivered from one or more of the heaters 604. The temperature in chamber 304 may be constant or may be increased over time. Temperatures in chamber 304 for forming the nanoislands may be between about 300° C. and about 1000° C. It should be noted that the processes performed in chamber 304 could also be performed in chamber 302 or chamber 306. However, the use of a separate chamber may reduce the total processing time needed in each chamber, thus increasing substrate throughput.

Next, during step 1806, as illustrated in FIGS. 15D and 18, graphitic nanofilaments 1506 are formed on the substrate S. By supplying a carbon containing precursor to the surface of the substrate S that contains the nanoislands 1504, graphitic nanofilaments 1506 can be formed on a surface of the substrate S disposed in the processing region 550. In one embodiment, the graphitic nanofilaments 1506 comprise carbon nanotubes or nanofibers that are single-walled or multi-walled. In chamber 306, process gases are provided to a showerhead 716 from one or more gas sources 718, 720 via valves 722, 724, respectively. Valves 722, 724 are controlled by signals received from the support circuits 311 of the system controller 305. The process gases provided to the showerhead 516 include carbon source gases used to form the nanotubes. Gases for the carbon source include, but are not limited to, xylene, ethylene, propylene, acetylene, benzene, toluene, ethane, methane, butane, propane, hexane, methanol, ethanol, propanol, isopropanol, carbon monoxide, acetone, oxygenated hydrocarbons, low-molecular-weight hydrocarbons, or combinations thereof. In some embodiments, the process to form the graphitic nanofilaments 1506 may be a plasma enhanced chemical vapor deposition (PECVD) process. To improve the film quality, increase the deposition rate and/or film uniformity, the CVD process may be enhanced by applying a bias to the showerhead 716 and/or substrate S. In one embodiment, a power supply 702 is configured to RF bias the showerhead 716 based on signals received from the support circuits 311 of the system controller 305. The applied voltage may be RF, DC or AC depending on the processing requirements. In another embodiment, an inductively coupled plasma may also be formed in the processing region 550 by use of the power supply 702 and one or coils (not shown) which are positioned to generate a plasma therein. In further embodiments, the process to form the graphitic nanofilaments 1506 may be a hot-wire chemical vapor deposition process (HWCVD), as described below with respect to FIG. 9.

Figure 8:
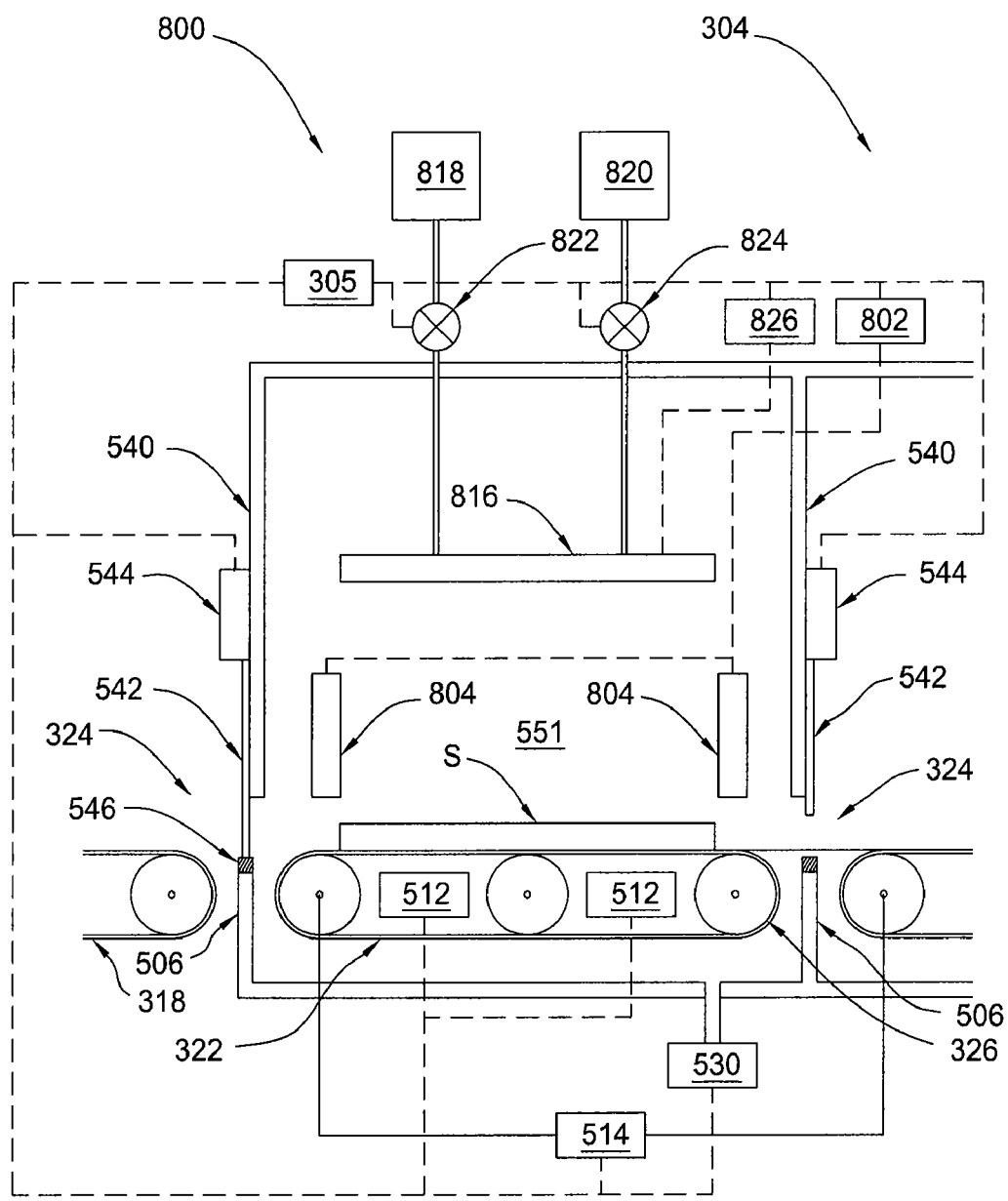
FIG. 8 is a schematic side view of one embodiment of a combination chamber for depositing and heating catalyst material to form nanoislands of catalyst material on substrates and for forming nanotubes on substrates.

In another embodiment, a combination chamber 800 of FIG. 8 is configured and adapted to perform the functions of chambers 302, 304 and 306, so that depositing and heating the catalyst material layer 1502 to form the nanoislands 1504 of catalyst material on the substrates S and then forming the graphitic nanofilaments 1506 on the substrates S can be performed in the processing region 551 of a single chamber. In this configuration, the processing steps 1802-1806 are all performed in the combination chamber 800. To perform these combined functions, chamber 800 includes a showerhead 816 that receives process gases from one or more gas sources 818, 820 via valves 822, 824, respectively. The valves 822, 824 are controlled by signals received from the support circuits 311 of the system controller 305. The gases for forming the catalyst material on the substrate and the gases for forming the graphitic nanofilaments may be sequentially supplied, or may be simultaneously provided (co-flowed). By first providing the gases required to form the catalyst, then heating the catalyst to form the nanoislands, and following with the gases to form the graphitic nanofilaments, graphitic nanofilaments that are relatively free of catalyst particles can be formed. When the gases for forming the catalyst and the graphitic nanofilaments are simultaneously provided, some amount of catalyst particles may be present on the graphitic nanofilaments. In some applications, a small amount of contamination is acceptable. Thus, the increased substrate throughput of a co-flowed method may be desirable. To provide the necessary heat for forming the nanoislands and graphitic nanofilaments, a heater power supply 802 receives control signals from the support circuits 311 of the system controller 305, to supply power to one or more of the heaters 804 (e.g., radiant heat lamps or resistive heaters). In one embodiment of a plasma enhanced deposition process, a plasma may be generated by delivering power from a power source 826 to the showerhead 816 based on signals received from the support circuits 311 of the system controller 305. In HWCVD embodiments, chamber 800 includes a hot-wire, as described below with respect to FIG. 9.

Figure 9:
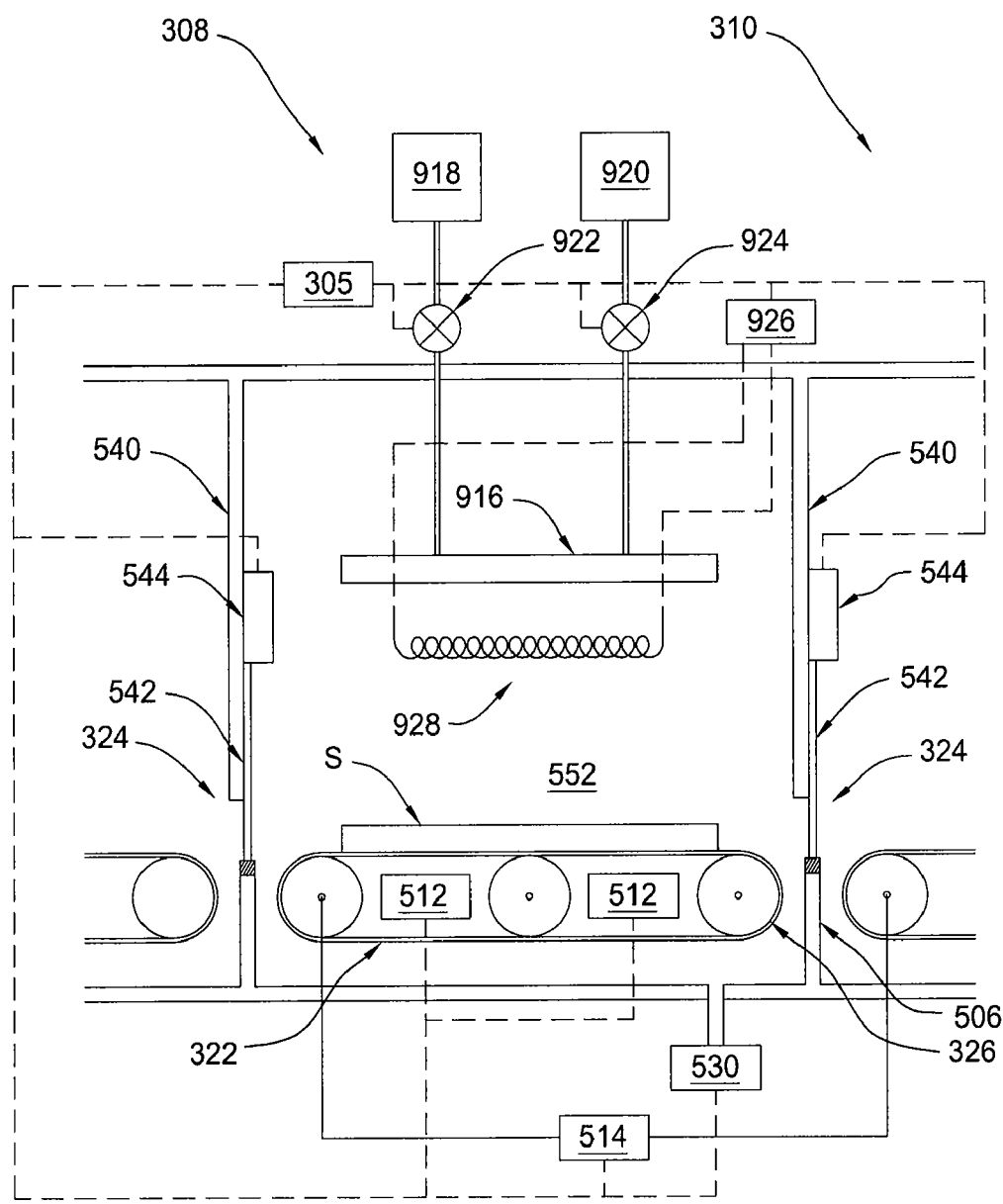
FIG. 9 is a schematic side view of one embodiment of a chamber for depositing amorphous silicon on the nanotubes.

Next, during step 1808, as illustrated in FIGS. 15E and 18, a silicon containing layer is deposited over the graphitic nanofilaments 1506 formed during step 1806. In one embodiment, the silicon containing layer is an amorphous silicon layer that is between about 0.5 nm and about 10 nm thick. In one embodiment, an amorphous silicon layer is formed over the graphitic nanofilaments 1506 using a hot wire chemical vapor deposition (HWCVD) process. In one embodiment, as shown in FIG. 9, a chamber 308 is configured and adapted to deposit the amorphous silicon on the graphitic nanofilaments using a HWCVD process. The HWCVD process generally uses a hot filament (usually tungsten or tantalum) to "crack" the reactive gas components (e.g., silane and hydrogen) into atomic radicals. The hot filament is typically maintained at a surface temperature significantly higher than 1500° C. The reactive species, after passing across the surface of the hot filament, are transported through a processing region 552 to the substrate in a low pressure ambient which enables a high deposition rate without gas-phase particle formation. In one example, as shown in FIG. 15E, a layer of amorphous silicon 1508 is deposited and conformably coats the graphitic nanofilaments 1506. To accomplish this, the chamber 308 includes a showerhead 916 that receives process gases from one or more gas sources 918, 920 via valves 922, 924, respectively. The valves 922, 924 are controlled by signals received from the support circuits 311 of the system controller 305. The gases supplied by the shower head 916, for forming amorphous silicon on the graphitic nanofilaments include, for example, hydrogen ($H_2$), silane ($SiH_4$), disilane ($Si_2H_6$), silicon tetrafluoride ($SiF_4$), silicon tetrachloride ($SiCl_4$), and/or dichlorosilane ($SiH_2Cl_2$). To assist in the CVD process, a resistive wire 928 is placed in close proximity to the substrate S. Electrical current is supplied to the wire 928 by a power supply 926, based on signals received from the support circuits 311 of the system controller 305. The electrical current heats the wire 928 to form the amorphous silicon 1508 on the graphitic nanofilaments 1506.

Figure 10:
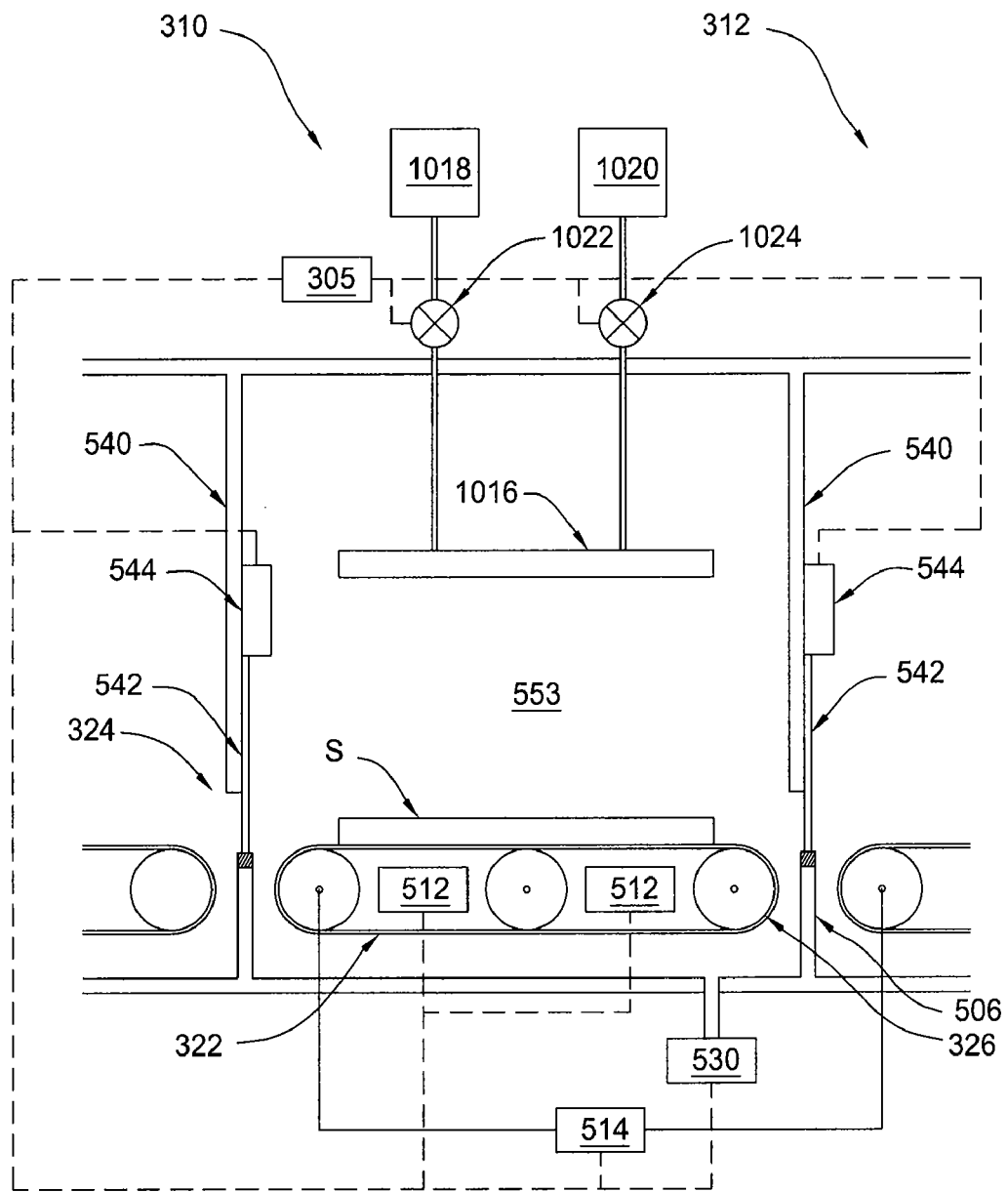
FIG. 10 is a schematic side view of one embodiment of a chamber for depositing polymeric material on the nanotubes.

Next, during step 1810, as illustrated in FIGS. 15F and 18, a polymeric layer is deposited over the silicon containing layer formed during step 1808. In one embodiment, after the amorphous silicon 1508 is deposited on the surface of the substrate, a polymeric material 1510, such as a polytetrafluoroethylene (PTFE), is deposited thereon. The polymeric material 1510 is generally used to provide a dielectric barrier and/or encapsulate both the graphitic nanofilaments 1506 and the amorphous silicon 1508. In one embodiment, the formed layer of polymeric material 1510 is porous. In one embodiment, chamber 310 of FIG. 10 is configured and adapted to deposit polymeric material 1510 on the amorphous silicon 1508 and graphitic nanofilaments 1506 using an initiated chemical vapor deposition (iCVD) process. The iCVD process generally involves the vapor phase delivery of both initiator species and monomers into a processing region 553 of the processing chamber 310 that is maintained in a vacuum state. In one embodiment, the polymeric material 1510 is formed on the surface of the substrate by use of a hot wire chemical vapor deposition (HWCVD) process. In one embodiment, the chamber 310 is configured to deposit the polymeric material 1510 using a low temperature HWCVD process in which the filament temperature is maintained at a temperature between about 1000° C. and 2100° C. while the substrate temperature is maintained between about 300° C. and 450° C., such as about 400° C. In the chamber 310, a showerhead 1016 receives process gases from one or more gas sources 1018, 1020 via valves 1022, 1024, respectively. The valves 1022, 1024 are controlled by signals received from the support circuits 311 of the system controller 305. One of the gas sources may include the initiator species. Such gases include, but are not limited to, perfluorooctane solfonyl fluoride, triethylamine, tert-butyl peroxide, 2,2' azobis (2methylpropane) and benzophenone. Another of the gas sources may provide the monomer. Such gases include but are not limited to fluoropolymer type material.

Figure 11:
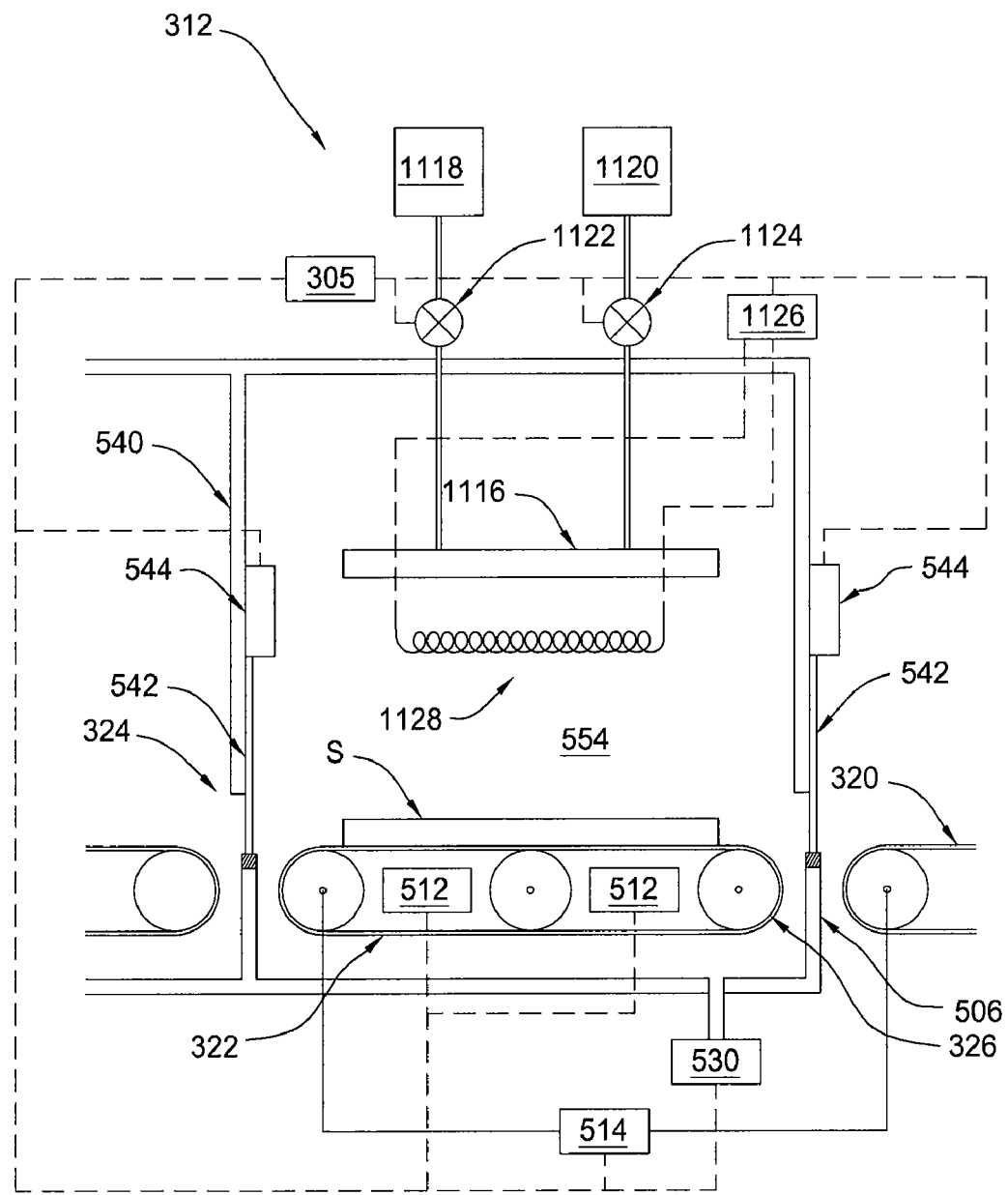
FIG. 11 is a schematic side view of one embodiment of a chamber for depositing cathodic material on the nanotubes.

During step 1810, as illustrated in FIGS. 15G and 18, a cathodic layer 1512 of material is deposited on top of the polymeric material 1510, to form a cathode and complete the composite material structure. In one embodiment, the cathodic layer 1512 is a lithium (Li) based material, such as lithium transition metal oxides, such as $LiMn_2O_4$, $LiCoO_2$, and/or combinations of Ni, Fe and/or Li oxides. In one embodiment, the cathodic material includes a series of layers which include a lithium containing layer and a metal layer. In one example, the metal layer includes but is not limited to include aluminum, stainless steel, and nickel. In one embodiment, chamber 312 of FIG. 11 is configured and adapted to deposit cathodic material on the polymeric material, using either a PVD, PECVD, CVD, iCVD or HWCVD process. In one example, the chamber 312 is similarly configured like chamber 302, shown in FIG. 5A, to perform a PVD process that is able to deposit the cathodic layer of material on the surface of the substrate. In another example, chamber 312 is configured to deposit the cathodic layer using a CVD process. In this configuration, a showerhead 1116 delivers the process gases to the processing region 554 from one or more gas sources 1118, 1120 via valves 1122, 1124, respectively. The valves 1122, 1124 are controlled by signals received from the support circuits 311 of the system controller 305. Such gases include, but are not limited to, metal organic precursors, carrier gases, or other similar gases. In HWCVD processes, the chamber 312 may include a resistive wire 1128 that is positioned in close proximity to the substrate S to help improve the reactivity of the process gas species. Electrical current is supplied to the wire 1128 by a power supply 1126, based on signals received from the support circuits 311 of the system controller 305. The electrical current heats the wire 1128 to assist in the formation of the cathodic material layer 1512 on the polymeric material 1510. Some examples of cathode materials include $LiCoO_2$, $LiMn_2O_4$, $LiFePO_4$ and $Li_2FePO_4$. The wire 1128 or filament temperature, in one embodiment, is maintained between about 300° C. to 1600° C., while the substrate temperature is maintained between about 100° C. to about 700° C. In some embodiments the operating pressures vary from about 1 mTorr to about 10 Torr. Once the cathodic material 1512 is deposited on the polymeric material 1510, door 542 (on the right side of the chamber 312) is opened and the conveyor 322 directs the completed substrate S (303 in FIG. 3) through the door 542 and onto exit conveyor 320.

In one embodiment, the process sequence 1800 further comprises separating the composite material layers formed during steps 1802-1812 from the support material 212 (substrate) so that the support material 212 can be reused in the processing system. In one configuration, it is desirable to use a sacrificial layer, such as a buffer layer 213 (FIG. 2A) between the deposited composite material layers and the support material 212, so that the composite material layers can be easily separated from the support material 212.

Alternate Deposition Processes

In addition to the graphitic nanofilament based composite materials described above, apparatus 300, 400, 2100 or 2200 may also be used to form portions of a photovoltaic (PV) device, or solar cell. FIG. 19 illustrates a process sequence 1900 used to form the composite materials on a surface of a substrate S to form one or more regions of a solar cell device. The sequence found in FIG. 19 corresponds to the stages depicted in FIGS. 16A-16F, which are discussed herein. The substrate S, which is illustrated in FIG. 16A, may be a discrete substrate such as substrates 301 and 303 in FIG. 3, or substrate S may be in the form of a web 401 of material in FIG. 4A or 2201 in FIG. 22.

Figure 12:
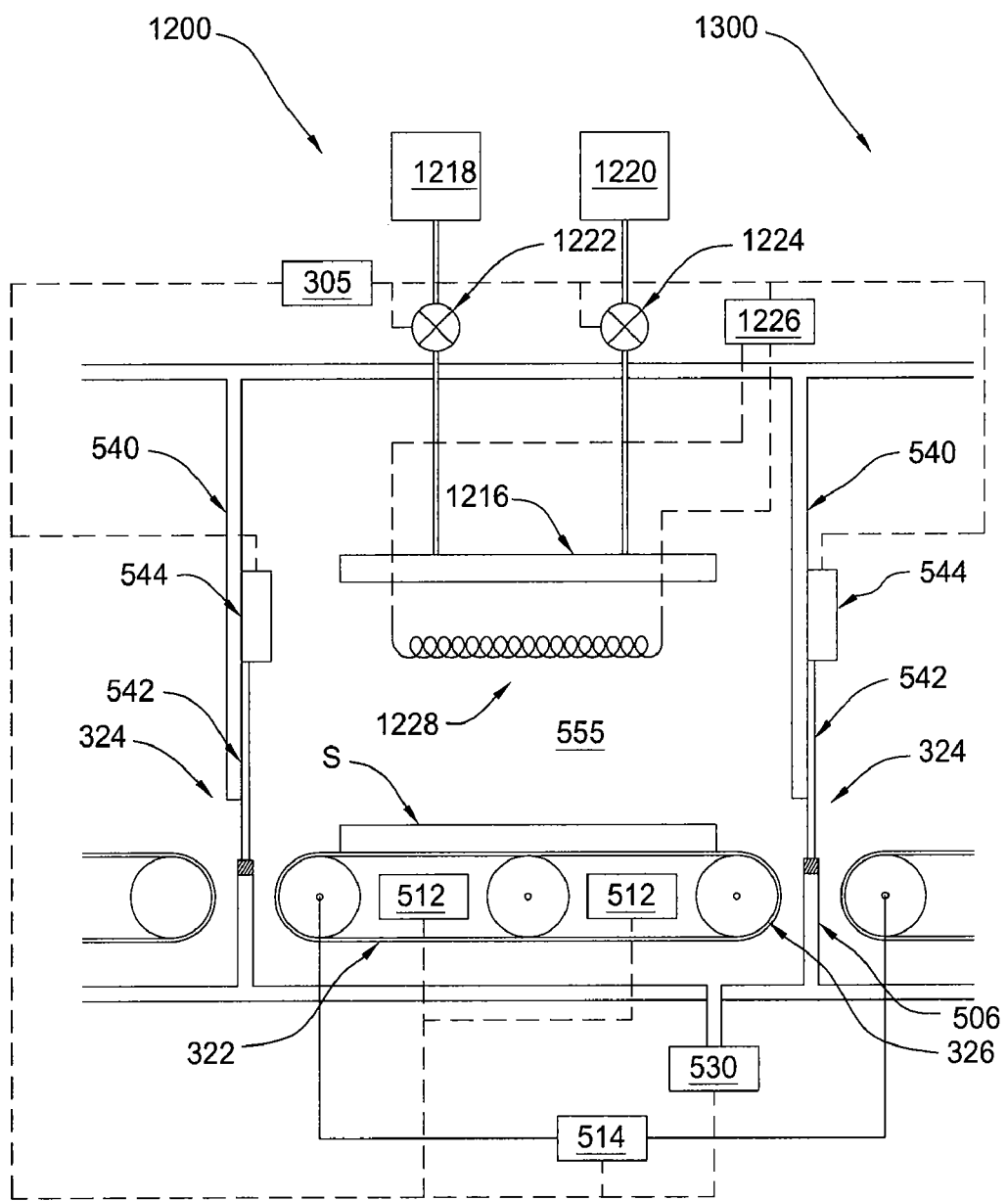
FIG. 12 is a schematic side view of one embodiment of a chamber for depositing intrinsic silicon on substrates.

At step 1902, as shown in FIGS. 12, 16B and 19, a substrate S is positioned in the processing chamber 1200 and a layer of intrinsic silicon layer 1602 deposited on the substrate S. In one embodiment, chamber 1200 is configured to deposit an intrinsic silicon layer on the substrate using a showerhead 1216 that delivers the process gases to a processing region 555 from one or more gas sources 1218, 1220 via valves 1222, 1224, respectively. The valves 1222, 1224 are controlled by signals received from the support circuits 311 of the system controller 305. The gases supplied by the shower head 1216, for forming intrinsic silicon on the substrates include hydrogen ($H_2$), silane ($SiH_4$), disilane ($Si_2H_6$), silicon tetrafluoride ($SiF_4$), silicon tetrachloride ($SiCl_4$), and/or dichlorosilane ($SiH_2Cl_2$). In one embodiment, a HWCVD process is performed that uses a resistive wire 1228 to deliver energy to the reactive gases to improve the deposition process speed and film properties. The resistive wire 1228 is heated by delivering an electrical current through the wire by use of a power supply 1226, based on signals received from the support circuits 311 of the system controller 305. The electrical current heats the wire 1228 to assist in forming the intrinsic silicon layer 1602 on the substrate S. After deposition of the intrinsic silicon, the door 542 (on the right side of the chamber 1200) is opened and the conveyor 322 directs the substrate S through the door 542 and into the chamber 1300. It should be noted that while FIG. 12 shows chamber 1200 to the right of an adjacent chamber, chamber 1200 may be configured as the first chamber (302 or 402) of the apparatus 300 or 400 and receives substrate(s) from the input conveyor 318 or the supply roll 418.

Figure 13:
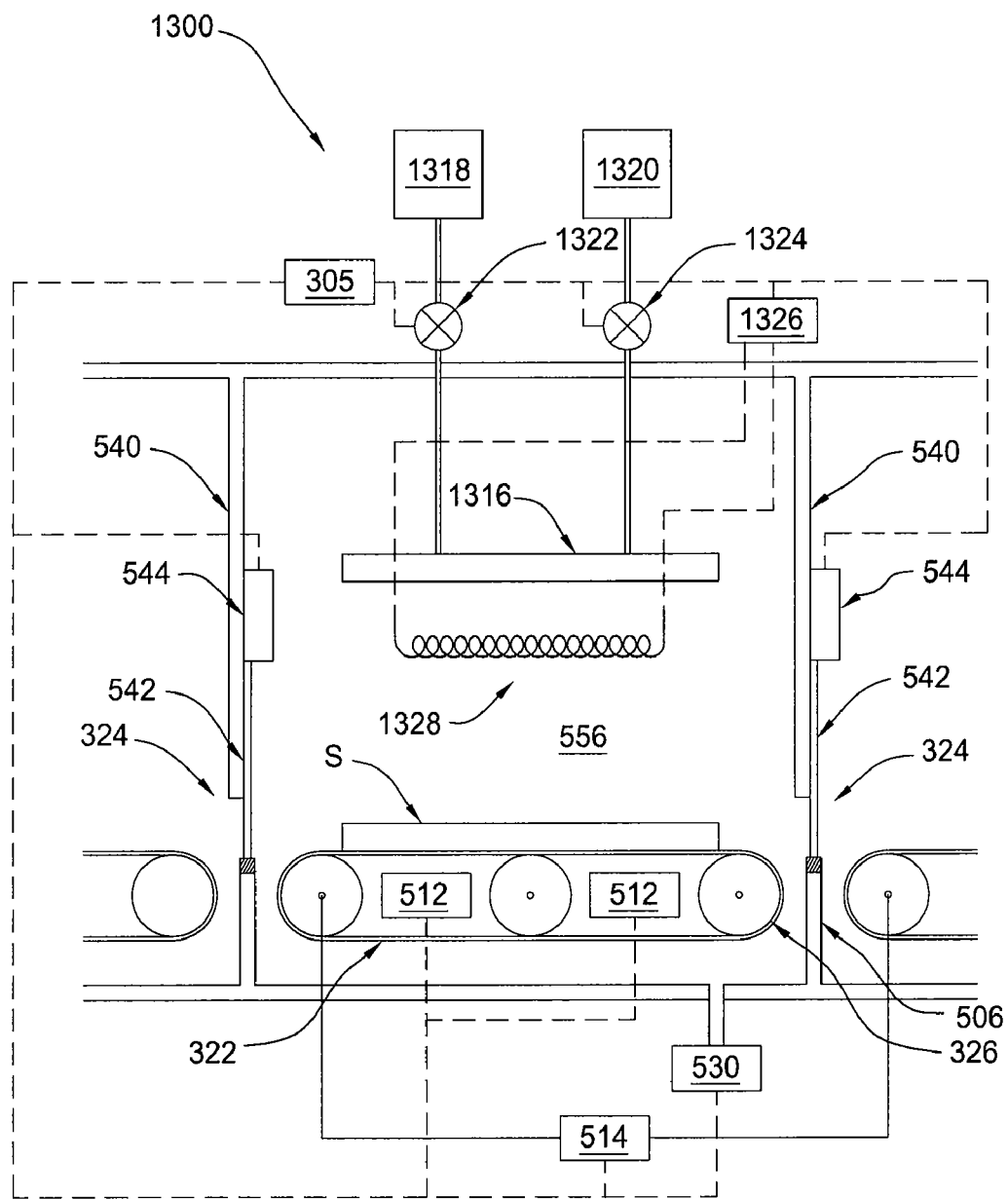
FIG. 13 is a schematic side view of one embodiment of a chamber for depositing doped silicon on substrates.

Next, during step 1904, as illustrated in FIGS. 16C and 19, a doped silicon layer 1604 is disposed over the intrinsic silicon layer 1602. In one embodiment, the chamber 1300 of FIG. 13 is configured and adapted to deposit doped silicon on the intrinsic silicon layer disposed on the substrate S. The chamber 1300 includes a showerhead 1316 that delivers the process gases to a processing region 556 from one or more gas sources 1318, 1320 via valves 1322, 1324, respectively. The valves 1322, 1324 are controlled by signals received from the support circuits 311 of the system controller 305. The gases supplied by the shower head 1316, for forming doped silicon may include, but are not limited to hydrogen ($H_2$), silane ($SiH_4$), disilane ($Si_2H_6$), silicon tetrafluoride ($SiF_4$), silicon tetrachloride ($SiCl_4$), dichlorosilane ($SiH_2Cl_2$), trimethylboron (TMB (or $B(CH_3)_3$)), diborane ($B_2H_6$), $BF_3$, $B(C_2H_5)_3$, and phoshine ($PH_3$). To assist in the CVD process, a resistive wire 1328 is placed in close proximity to the substrate S. Electrical current is supplied to the wire 1328 by a power supply 1326, based on signals received from the support circuits 311 of the system controller 305. The electrical current heats the wire 1328 to assist in forming the doped silicon layer 1604 on the intrinsic silicon layer 1602. After deposition of the doped silicon, the door 542 (on the right side of the chamber 1200) is opened and the conveyor 322 directs the substrate S through the door 542 and out of chamber 1300.

Figure 14:
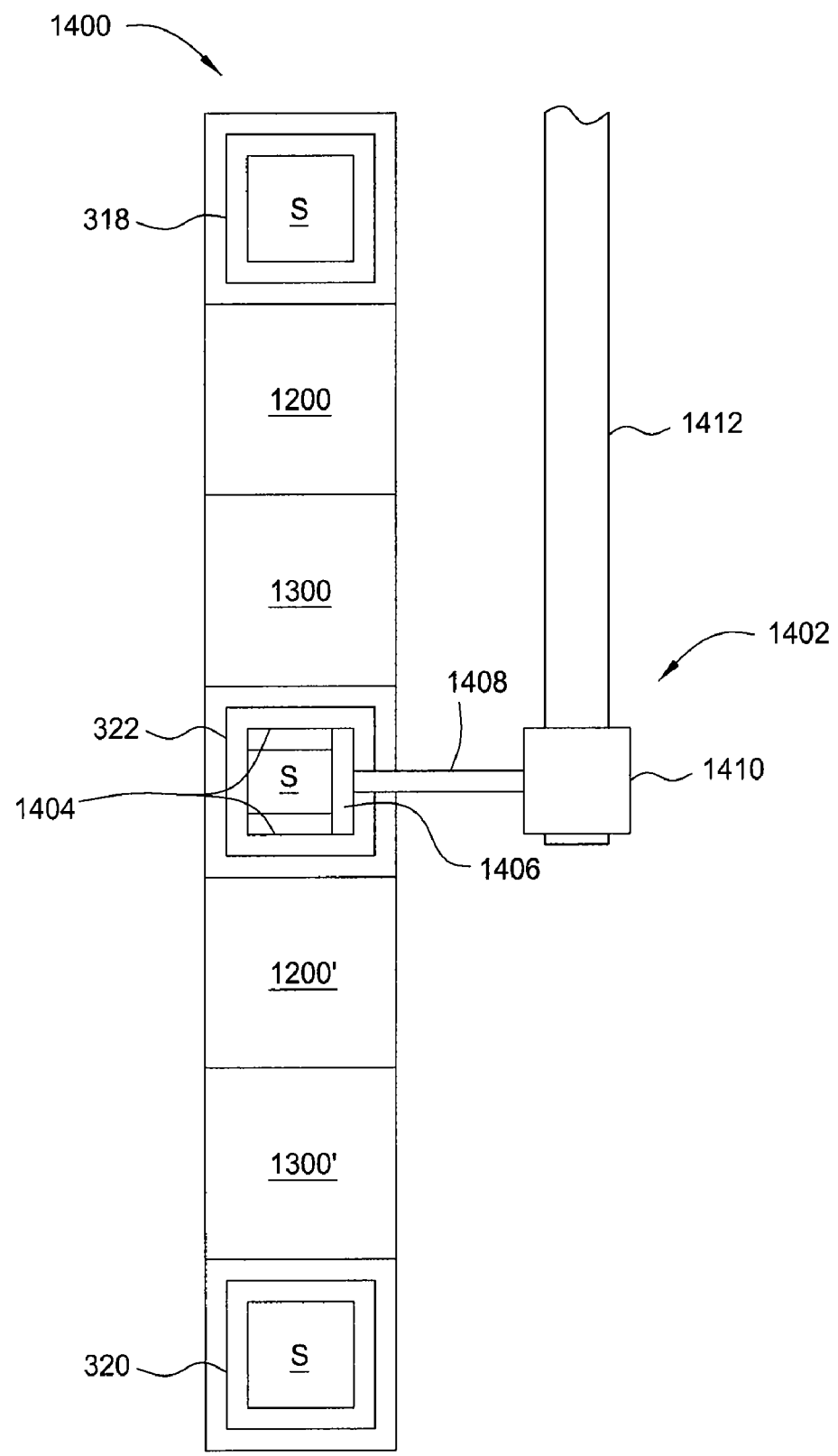
FIG. 14 is a schematic plan view of another embodiment of an apparatus for forming composite materials on large area substrates.

In FIG. 14 another embodiment of an apparatus 1400 for forming composite materials on a substrate is shown. Apparatus 1400 is generally similar to apparatus 300 as shown in FIG. 3, but further includes a robot 1402. The apparatus 1400 generally includes chambers 1200 and 1300 as described above. In one embodiment, the apparatus 1400 also includes additional chambers 1200' and 1300'. The robot 1402 includes a pair of blades 1404 attached to an end effector 1406. The blades are moveable relative to each other, to allow the robot 1402 to grasp and release a substrate S. The end effector 1406 is mounted to a rod 1408 that is supported by a robot carriage 1410. The rod 1408 is mounted to the robot carriage such that it can be rotated about its central axis, and can be retracted into the carriage and moved up and down relative to the carriage. After deposition of the doped silicon in step 1904, the substrate S is conveyed out of chamber 1300, and onto conveyor 322 of FIG. 14. During step 1906 (FIG. 16D) the substrate S is flipped over, by rotating the grasped substrate by rotating the rod 1408 until the unprocessed bottom of the substrate S is face-up. As shown in FIG. 16D, the substrate S is thus in an inverted position with the unprocessed bottom of the substrate S face-up and the doped silicon layer 1604 and the intrinsic silicon layer 1602 in a face-down orientation. The flipped substrate is then lowered onto the conveyor 322 for transport into chamber 1200'.

Next, during step 1908, as illustrated in FIGS. 16E and 19, a second layer of silicon, or second layer 1606 is then deposited onto the substrate S using the components found in chamber 1200, or chamber 1200', as described above with reference to FIG. 12. The substrate is then conveyed into chamber 1300 or 1300' and a second layer of doped silicon, or second doped layer 1608 is then deposited onto the second layer 1606 using the components in chamber 1300, or chamber 1300', as described above with reference to FIG. 13. The completed silicon-based composite material is then conveyed to output conveyor 320 or conveyor 322.

In one embodiment of the apparatus 1400, the system comprises only two chambers 1200 and 1300. In this configuration, the robot may be further adapted to reposition the substrate for loading into chamber 1200 after the flipping step has been performed (step 1906). In one embodiment, the robot 1402 may further include a track 1412 that is adapted to translate the robot between the output of chamber 1300 and the input of chamber 1200. Thus, after lifting the substrate and retracting the rod 1408 into the carriage 1410, the robot 1402 travels down the track 1412 and lowers the substrate S onto input conveyor 318. The robot also rotates rod 1408 until the unprocessed bottom of the substrate S is face-up during this process. The substrate S is then ready for transport back into chamber 1200.

Figure 14A:
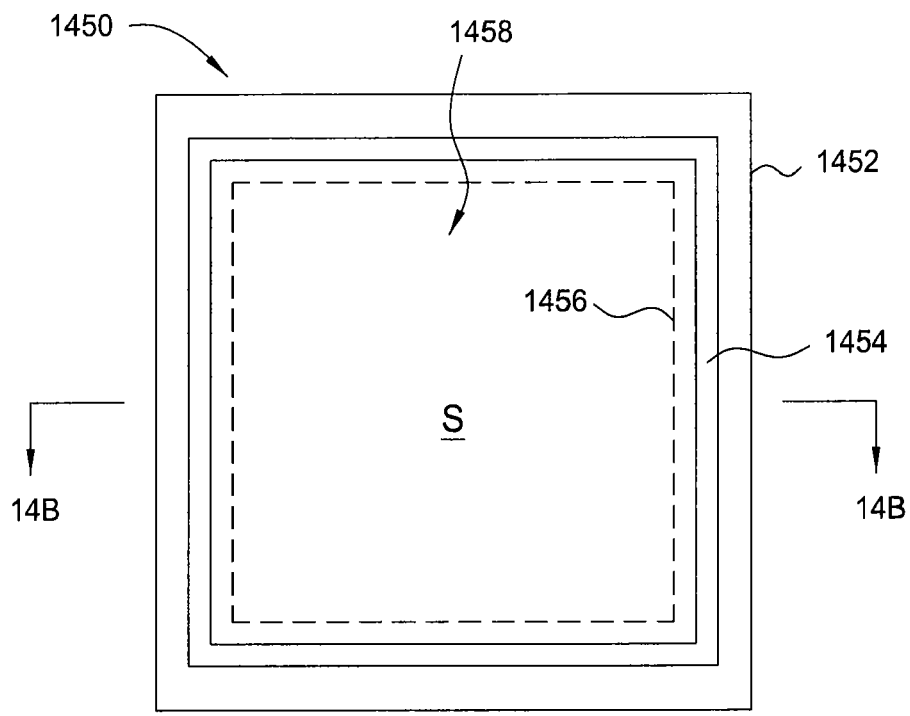
FIG. 14A is a schematic plan view of another embodiment of an apparatus for forming composite materials on a substrate.
Figure 14B:
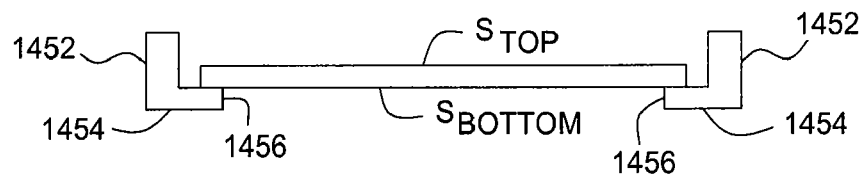
FIG. 14B is a cross-section of the apparatus of FIG. 14A taken through section line 14B-14B.
Figure 14C:
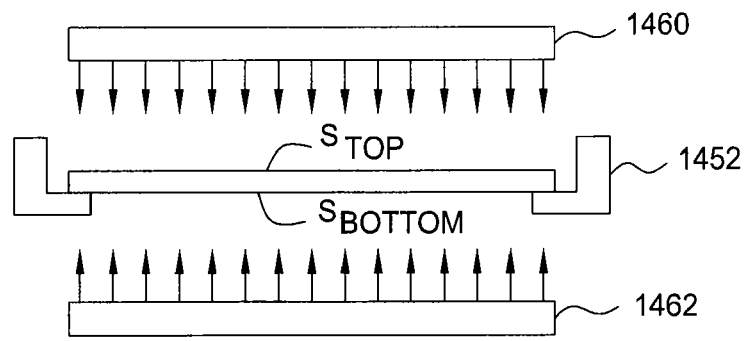
FIG. 14C is a schematic side view of the apparatus of FIG. 14A.

In FIGS. 14A-14C another embodiment of an apparatus 1450 for forming composite materials on a substrate S is shown. The apparatus 1450 includes a carrier 1452 with an open central portion 1458. A lip 1454 extends around the inside perimeter of carrier 1452 and supports a substrate thereon. The lip 1454 has an inner surface 1456 such that the open central portion 1458 is smaller in dimension than the substrate S to support the substrate S thereon. In one case the open central portion 1458 and lip 1454 is configured so that both the top surface $S_{Top}$ and most of its bottom surface $S_{Bottom}$ of the substrate S remain exposed. In FIG. 14C a top deposition apparatus 1460 and a bottom deposition apparatus 1462 are shown. The top deposition apparatus 1460 deposits material on the top surface $S_{Top}$ of the substrate S, while the bottom deposition apparatus 1462 deposits material on the bottom surface $S_{Bottom}$ of the substrate S. The deposition apparatus 1460, 1462, in one embodiment, comprise one of the deposition apparatuses shown with respect to chambers 1200 and 1300, which are discussed above. In one embodiment, one type of chamber 1200 and 1300 is used to deposit the intrinsic and doped silicon layers on both sides of the substrate as shown and described with respect to FIG. 16F above. Thus, in this configuration, the additional deposition chambers 1200' and 1300' as well as robot 1402 in FIG. 14 are not required in the apparatus of 1450. It should be noted that while only one open central portion 1458 is shown with respect to apparatus 1450, several open portions may be provided such that a plurality of substrates can be supported while they are disposed in a larger version of the carrier 1452. In addition, while open central portion 1458 is shown as square in shape, other shapes are contemplated to support substrates. Furthermore, while the open central portion 1458 is shown in a carrier 1452, such an open central portion could be provided in the belt of a continuous type apparatus which support the substrates S.

Figure 23:
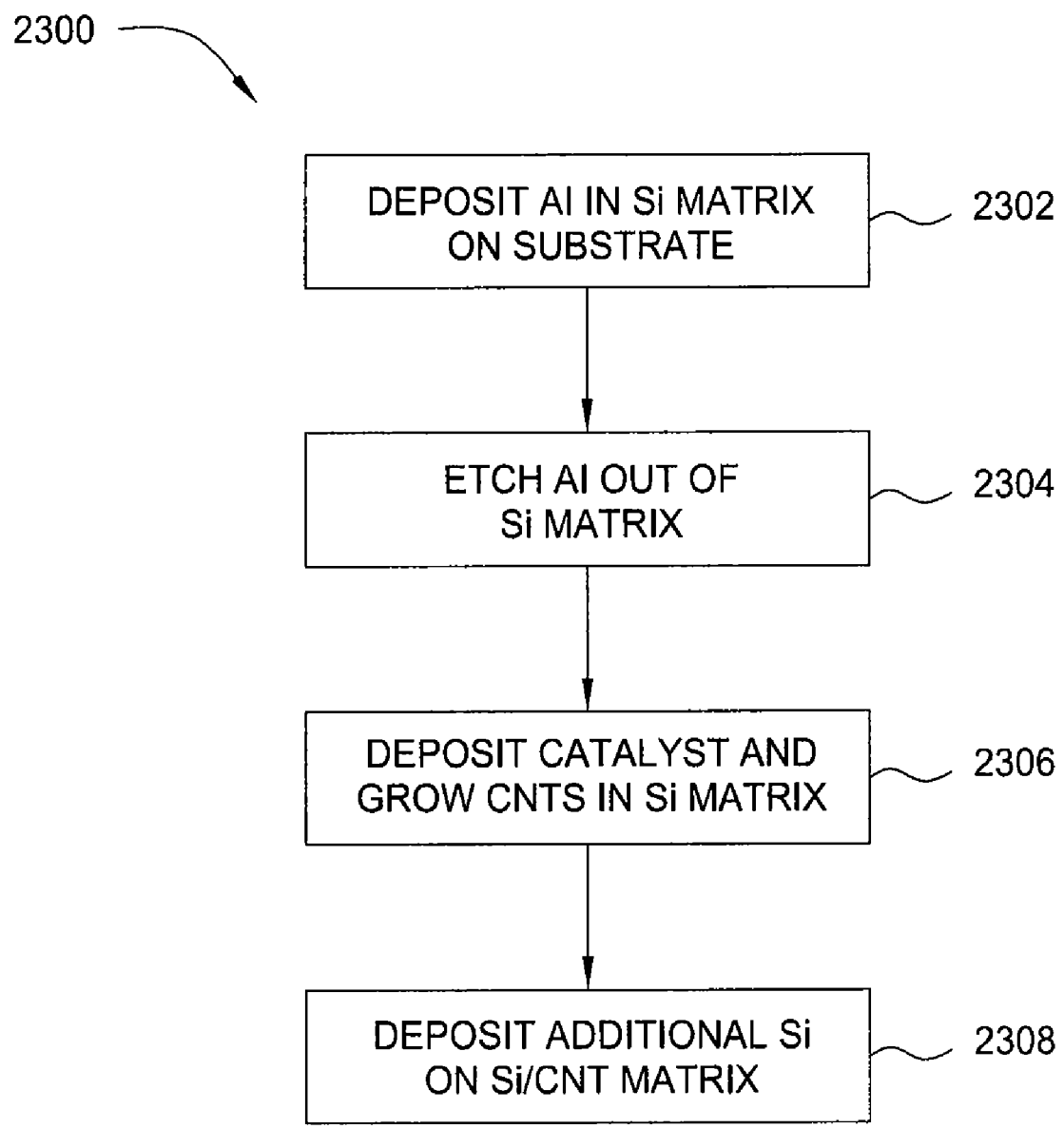
FIG. 23 is a process flow chart summarizing a method for forming a composite layer on a substrate according to a further embodiment of the invention.

In addition to the graphitic nanofilament based composite materials described above, apparatus 300, 400, 2100 or 2200 may also be used to form a different type of graphitic nanotube based composite material, such as a porous Si-CNT electrode structure. FIG. 23 illustrates a process sequence 2300 used to form the composite material on a surface of a substrate S. The sequence found in FIG. 23 corresponds to the stages depicted in FIGS. 20A-20D, which are discussed herein. The substrate S, which is illustrated in FIG. 20A, may be a discrete substrate such as substrates 301 and 303 in FIG. 3, or substrate S may be in the form of a web 401 of material in FIG. 4A or 2201 in FIG. 22.

Figures 20A, 20B:
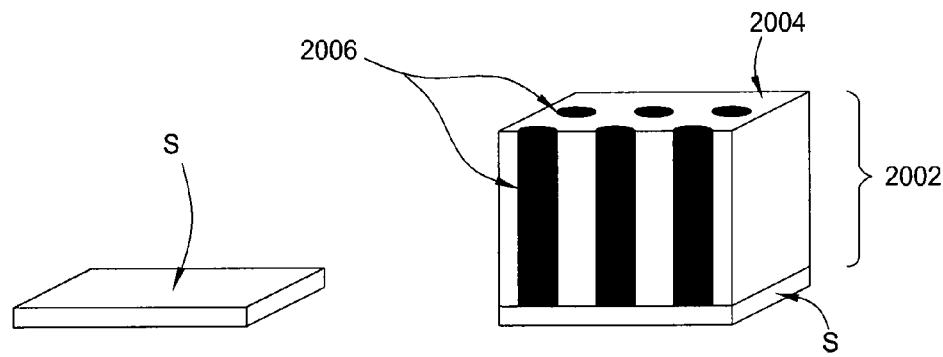
FIGS. 20A-20D are schematic isometric views showing the various stages of forming carbon nanotube based composite materials according to further embodiments of the invention

At step 2302, as shown in FIGS. 20B and 23, a substrate S is positioned in a chamber and a layer 2002 of a silicon (Si) matrix 2004 with an Aluminum (Al) phase 2006 segregated therein is deposited on the substrate S. In one embodiment, the chamber used to deposit layer 2002 is a PVD chamber such as the chamber 302 in FIG. 5A, the chambers 2108, 2114 or 2118 in FIG. 21, the chamber 2202 in FIG. 22, or any chamber configured to deposit layer 2002. In some embodiments layer 2002 is sputter deposited, as will now be described with respect to chamber 302 in FIG. 5A. In one embodiment, the chamber 302 of FIG. 5A, is configured and adapted to deposit the layer 2002 on a substrate S during step 2302, using a sputtering deposition process. A target 508 of $Al_{56}Si_{44}$ is provided in the chamber 302. A power source 510 is connected to the target 508 so that a cathodic DC and/or RF bias can be applied to the target 508 so that the layer 2002 can be deposited on the surface of the substrate S. The plasma generated by the bias applied to the target 508 causes atoms from the target surface to be removed, and be deposited on the exposed surfaces of the substrate S. In one embodiment, the power supplied by the power source is between about 100 W and about 200 W. In embodiments requiring heating of the substrates, one or more heating elements 512 may be provided. The heating elements 512 may comprise resistive heating elements, induction coils, or other heating means. In one embodiment, the heating elements 512 maintain a substrate temperature of between about 20° C. and about 300° C. (preferably below 150° C.) in an inert environment. As layer 2002 is sputtered onto the substrate S, the aluminum phase 2006 is segregated in the silicon matrix 2004.

Figures 20C, 20D:
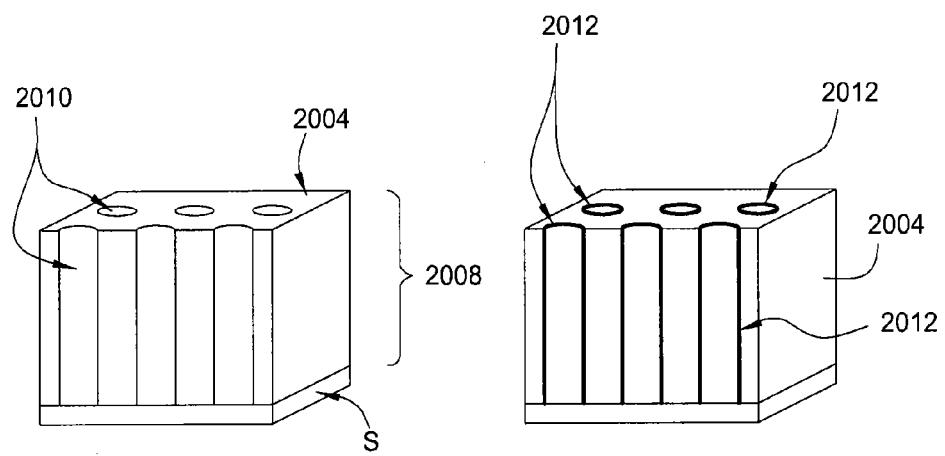

After the formation of layer 2002 on the substrate S, process 2300 proceeds to step 2304. In step 2304, the aluminum is etched out of the silicon matrix. In one embodiment, the etching of the aluminum is performed using a wet etch process, such as a process using a sodium hydroxide (NaOH) solution. The etch process may be performed in the chamber 2204 of apparatus 2200, or in any of the chambers of apparatus 300, 400 or 2100 that are configured for etching. Suitable etching chambers are available from Applied Materials, Inc., located in Santa Clara, Calif. The etching process may be a dry etch process using an etching gas that contains $Cl_2$ or $H_2$ in an RF inductively or capacitively coupled plasma processing chamber. After the aluminum has been etched out of the silicon matrix, the resulting structure is as is shown in FIG. 20C. The substrate S includes a porous silicon layer 2008 disposed thereon. The porous silicon layer 2008 is formed by the silicon matrix 2004 with the aluminum 2006 removed to form a plurality of pores 2010.

Next, during step 2306, as illustrated in FIGS. 20D and 23, carbon nanotubes (CNT) 2012 are deposited in the pores 2010 of silicon matrix 2004. In one embodiment, the chamber 2206 of apparatus 2200 in FIG. 22 is configured and adapted to deposit the CNT's 2012 in the porous silicon matrix 2004 using a CVD process. One such CVD chamber suitable for the growth of CNT's is the chamber 800 of FIG. 8. The CNT's can be grown in the porous silicon matrix 2004 by first depositing and heating catalyst material to form nanoislands of catalyst material in the pores of silicon matrix 2004 in the processing region 551 of the chamber 800. To perform these functions, chamber 800 includes a showerhead 816 that receives process gases from one or more gas sources 818, 820 via valves 822, 824, respectively. The valves 822, 824 are controlled by signals received from the support circuits 311 of the system controller 305. The gases for forming the catalyst material on the substrate and the gases for forming the CNT's may be sequentially supplied, or may be simultaneously provided (co-flowed). By first providing the gases required to form the catalyst, then heating the catalyst to form the nanoislands, and following with the gases to form the CNT's, CNT's that are relatively free of catalyst particles can be formed. When the gases for forming the catalyst and the CNT's are simultaneously provided, some amount of catalyst particles may be present on the resulting CNT's. In some applications, a small amount of contamination is acceptable. Thus, the increased substrate throughput of a co-flowed method may be desirable. To provide the necessary heat for forming the nanoislands and CNT's, a heater power supply 802 receives control signals from the support circuits 311 of the system controller 305, to supply power to one or more of the heaters 804 (e.g., radiant heat lamps or resistive heaters). In one embodiment of a plasma enhanced deposition process, a plasma may be generated by delivering power from a power source 826 to the showerhead 816 based on signals received from the support circuits 311 of the system controller 305. In HWCVD embodiments, chamber 800 includes a hot-wire, as described above with respect to FIG. 9.

After the deposition of CNT's in the silicon matrix, in some embodiments, additional silicon is deposited at step 2308 of process 2300, on the structure shown in FIG. 20D. The additional Si may be deposited using HWCVD or other suitable processes in the chamber 2208 of apparatus 2200, or in any other HWCVD enabled chamber such as chambers 308, 312, 1200 or 1300, described above. In one embodiment, the silicon containing layer is an amorphous silicon layer that is between about 5 nm and about 200 nm thick. In a further embodiment, the amorphous silicon layer is between about 13 nm and about 15 nm thick for a 15µ long tube. Referring to FIG. 9, the chamber 308 is configured and adapted to deposit the amorphous silicon on the Si/CNT matrix (2004 and 2012 of FIG. 20D) using a HWCVD process. The HWCVD process generally uses a hot filament (usually tungsten or tantalum) to "crack" the reactive gas components (e.g., silane and hydrogen) into atomic radicals. The hot filament is typically maintained at a surface temperature significantly higher than 1500° C. The reactive species, after passing across the surface of the hot filament, are transported through a processing region 552 to the substrate in a low pressure ambient which enables a high deposition rate without gas-phase particle formation. The chamber 308 includes a showerhead 916 that receives process gases from one or more gas sources 918, 920 via valves 922, 924, respectively. The valves 922, 924 are controlled by signals received from the support circuits 311 of the system controller 305. The gases supplied by the shower head 916, for forming amorphous silicon on the Si/CNT matrix include, for example, hydrogen ($H_2$), silane ($SiH_4$), disilane ($Si_2H_6$), silicon tetrafluoride ($SiF_4$), silicon tetrachloride ($SiCl_4$), and/or dichlorosilane ($SiH_2Cl_2$). To assist in the CVD process, a resistive wire 928 is placed in close proximity to the substrate S. Electrical current is supplied to the wire 928 by a power supply 926, based on signals received from the support circuits 311 of the system controller 305. The electrical current heats the wire 928 to form the amorphous silicon on the Si/CNT matrix.

The structure shown in FIG. 20D is advantageously used in the formation of an electrode structure for energy storage devices. The Si-CNT nanocomposite formed by depositing a plurality of nanotubes 2012 in the pores 2010 of the silicon matrix 2004, provides several advantages. On such advantage is that the partial exposure of the porous silicon allows for higher current capacity with a charge capacity per weight of the resulting energy storage device being in excess of 3600 mAh/g, or even 4200 mAh/g. Another advantage is the ability of the structure to accommodate volume expansion (such as thermal expansion) through the presence of the pores 2010. In addition, the nature of the CNT's when incorporated in the inventive structure provide for prolonged cycle life, excellent structural integrity and excellent electronic conduction pathways. The scalability of these nanostructures will also reduce costs of the final products in both electric vehicle (EV) and consumer electronic markets.

Figure 17A:
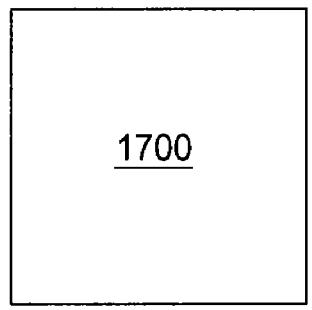
FIGS. 17A-17C are top views of composite materials according to embodiments of the invention.
Figure 17B:
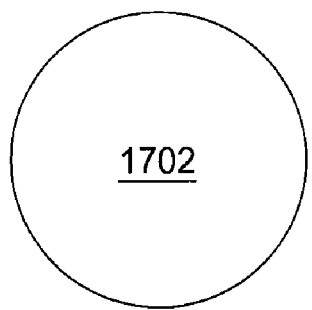
Figure 17C:
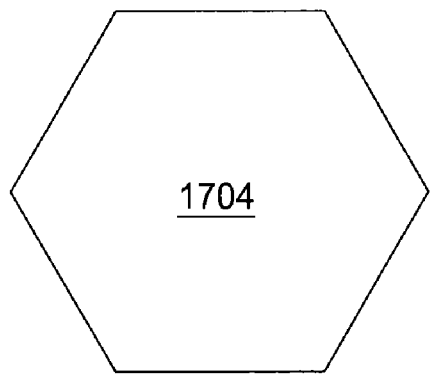

In FIGS. 17A-17C top views of composite material structures are shown to illustrate exemplary shapes of the structures. In FIG. 17A, the composite material structure 1700 is shown to have a rectangular shape, and in particular a square shape. In FIG. 17B, the composite material structure 1702 is shown to have a elliptical shape, and in particular a circular shape. In FIG. 17C, the composite material structure 1704 is shown to have the shape of a regular hexagon. It should be understood that these shapes are only presented as examples, and the composite material structures may be provided in any shape desired. In one embodiment, the shapes can be formed by cutting the substrate(s) (such as web 401 in FIG. 4A) into the desired shape after the deposition process. In other embodiments, discrete substrates (such as 301 in FIG. 3) may be provided in the desired shape prior to processing. In some embodiments, the structures 1700, 1702 and 1704 have a large area on the order of 5 $m^2$ or greater. As described above, the composite material structures 1700, 1702 and 1704 may be graphitic nanofilament-based structures useful in forming electrical storage devices, or they may be silicon-based structures for forming photovoltaic (PV) devices, according to embodiments of the invention.

While the foregoing is directed to embodiments of the present invention, other and further embodiments of the invention may be devised without departing from the basic scope thereof, and the scope thereof is determined by the claims that follow.

What is claimed is:

1. A method of forming composite materials on a substrate in a substrate processing system, comprising:
   depositing a catalytic layer on a surface of the substrate in a first processing chamber;
   processing the catalytic layer to form a plurality of nanoislands;
   forming a plurality of graphitic nanofilaments over the nanoislands;
   depositing a silicon containing layer over the graphitic nanofilaments in a second processing chamber; and
   depositing a polymer layer over the graphitic nanofilaments and silicon containing layer in a third processing chamber which is coupled to the second processing chamber.

2. The method of claim 1, wherein processing the catalytic layer and forming the plurality of graphitic nanofilaments are performed in the first processing chamber, wherein the first processing chamber is coupled to the second processing chamber.

3. The method of claim 1, wherein the forming the plurality of graphitic nanofilaments is performed in a fourth processing chamber, wherein the fourth processing chamber is coupled to the first and second processing chambers.

4. The method of claim 1, further comprising transferring the substrate between the first, second and third processing chambers using a conveyor system that is adapted to position a substrate in a processing region formed in each of the first, second and third processing chambers.

5. The method of claim 1, further comprising depositing a cathodic layer over the polymer layer in a fifth processing chamber which is coupled to the third processing chamber, wherein the cathodic layer comprises lithium transition metal oxides, aluminum, stainless steel, or nickel.

6. The method of claim 1, wherein:
   the depositing the catalytic layer on the surface of the substrate in the first processing chamber comprises depositing the catalytic layer on the surface of the substrate using a physical vapor deposition process;
   the depositing the silicon containing layer on the surface of the substrate in the second processing chamber comprises depositing the silicon containing layer using a hot wire chemical vapor deposition process; and
   the depositing the polymer layer over the graphitic nanofilaments and silicon containing layer in the third processing chamber comprises depositing the polymer layer using a hot wire chemical vapor deposition process.

7. The method of claim 6, wherein the catalytic layer has a thickness less than about 20 nm.

8. The method of claim 1, wherein processing the catalytic layer comprises heating the substrate to a temperature between about 300° C. and 1000° C., and wherein processing the catalytic layer further comprises heating the substrate in an environment comprising hydrogen or ammonia.

9. The method of claim 1, wherein depositing the polymer layer over the graphitic nanofilaments and silicon containing layer in the third processing chamber comprises delivering a process gas across a heated filament maintained at a surface temperature less than about 450° C.

10. A method of forming composite materials on a substrate in a substrate processing system, comprising:
   depositing a composite layer on a surface of the substrate in a first processing chamber, the composite layer comprising aluminum segregated in a silicon matrix;
   etching the aluminum out of the silicon matrix in a second processing chamber to form a porous silicon layer on the substrate, wherein the second processing chamber is coupled to the first processing chamber;
   forming a plurality of carbon nanotubes in the porous silicon layer in a third processing chamber to form an silicon matrix layer on the substrate, wherein the third processing chamber is coupled to the second processing chamber; and
   depositing a silicon layer over the silicon matrix layer in a fourth processing chamber which is coupled to the third processing chamber.

* * * * *